(12) United States Patent
Fujii et al.

(10) Patent No.: US 11,705,072 B2
(45) Date of Patent: Jul. 18, 2023

(54) DISPLAY DEVICE AND ELECTRONIC APPARATUS

(71) Applicant: Sony Semiconductor Solutions Corporation, Kanagawa (JP)

(72) Inventors: Takuma Fujii, Kanagawa (JP); Naobumi Toyomura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/871,204

(22) Filed: Jul. 22, 2022

(65) Prior Publication Data

US 2023/0017349 A1  Jan. 19, 2023

Related U.S. Application Data

(63) Continuation of application No. 17/067,163, filed on Oct. 9, 2020, now Pat. No. 11,430,389, which is a (Continued)

(30) Foreign Application Priority Data

Sep. 21, 2016  (JP) ................. 2016-184280

(51) Int. Cl.
    *G09G 3/3266* (2016.01)
    *H10K 50/125* (2023.01)
    (Continued)

(52) U.S. Cl.
    CPC ......... *G09G 3/3266* (2013.01); *H10K 50/125* (2023.02); *H10K 59/1213* (2023.02);
    (Continued)

(58) Field of Classification Search
None
See application file for complete search history.

(56) References Cited

U.S. PATENT DOCUMENTS

| | | | |
|---|---|---|---|
| 8,736,522 B2 | 5/2014 | Taneda et al. | |
| 2008/0029768 A1 | 2/2008 | Asano et al. | |
| 2014/0284571 A1 | 9/2014 | Nomura | |
| 2014/0292622 A1 | 10/2014 | Lee | |

(Continued)

FOREIGN PATENT DOCUMENTS

| | | | |
|---|---|---|---|
| JP | 2015-055763 A | 3/2015 | |
| JP | 2015-111275 A | 6/2015 | |

(Continued)

*Primary Examiner* — Michelle Mandala
(74) *Attorney, Agent, or Firm* — Michael Best & Friedrich LLP

(57) ABSTRACT

[Object] It is possible to further improve reliability.

[Solution] There is provided a display device including: a pixel unit which is configured with a plurality of pixel circuits arranged in a matrix, each of the pixel circuits including a light emitting element and a driving circuit for driving the light emitting element; scanning lines which are interconnections connected to the respective pixel circuits and are provided to extend in a first direction and correspond to respective rows of a plurality of the pixel circuits; and signal lines which are interconnections connected to the respective pixel circuits and are provided to extend in a second direction orthogonal to the first direction and correspond to respective columns of a plurality of the pixel circuits. One of the scanning lines and the signal lines, provided for the one pixel circuit, which is larger in number is positioned in a lower-level interconnection layer. An electrode of a capacitance element included in the driving circuit is positioned in the interconnection layer in which either the scanning lines or the signal lines are provided.

4 Claims, 17 Drawing Sheets

Related U.S. Application Data continuation of application No. 16/323,616, filed as application No. PCT/JP2017/027160 on Jul. 27, 2017, now Pat. No. 10,839,752.

(51) Int. Cl.
    *H10K 59/131*     (2023.01)
    *H10K 59/121*     (2023.01)
    *G09G 3/3233*     (2016.01)

(52) U.S. Cl.
    CPC ....... *H10K 59/1216* (2023.02); *H10K 59/131* (2023.02); *G09G 3/3233* (2013.01); *G09G 2300/0426* (2013.01); *G09G 2320/0233* (2013.01)

(56) References Cited

U.S. PATENT DOCUMENTS

| | | | |
|---|---|---|---|
| 2014/0313448 | A1 | 10/2014 | Kinoe |
| 2015/0212376 | A1 | 7/2015 | Hayashi |
| 2015/0221253 | A1* | 8/2015 | Yamamoto ........... G09G 3/3233 |
| | | | 315/172 |
| 2016/0322440 | A1 | 11/2016 | Murata |
| 2017/0025441 | A1 | 1/2017 | Mori |
| 2017/0250289 | A1* | 8/2017 | Sugawara ......... H01L 21/02233 |

FOREIGN PATENT DOCUMENTS

| | | |
|---|---|---|
| JP | 2016-053636 A | 4/2016 |
| JP | 2016-053640 A | 4/2016 |
| JP | 2016-053641 A | 4/2016 |
| JP | 2016053639 A | 4/2016 |
| JP | 2016-114780 A | 6/2016 |
| JP | 2016-154229 A | 8/2016 |
| KR | 10-20050104611 A | 11/2005 |

* cited by examiner

DISPLAY DEVICE AND ELECTRONIC APPARATUS

CROSS REFERENCE TO RELATED APPLICATIONS

This Application is a Continuation Application of application Ser. No. 17/067,153, filed Oct. 9, 2020, which is a Continuation Application of application Ser. No. 16/323,616, filed Feb. 2, 2019, now U.S. Pat. No. 10,839,752, issued on Nov. 17, 2020, which is a national stage of PCT/JP2017/027160, filed Jul. 27, 2017, which claims the benefit of Japanese Patent Application JP 2016-184280 filed on Sep. 21, 2016, the contents of which are incorporated herein by reference in their entirety.

TECHNICAL FIELD

The present disclosure relates to a display device and an electronic apparatus.

BACKGROUND ART

A display device drivable by what is called an active matrix system usually has a configuration in which a light emitting element and a pixel circuit including a driving circuit for causing the light emitting element to be driven are provided in a position corresponding to each of the points of intersection of a plurality of scanning lines that extend along a lateral direction (hereinafter, occasionally referred to as a horizontal direction) of a display surface and are placed to be arranged in an upright direction (hereinafter, occasionally referred to as a vertical direction) of the display surface and a plurality of data lines (signal lines) that extend along the vertical direction and are placed to be arranged in the horizontal direction. One pixel circuit corresponds to one pixel or sub-pixel. The electric potentials of the scanning line and the signal line are changed at appropriate timings; thereby, the on/off of an active element (a transistor or the like) provided in the driving circuit in the pixel circuit is controlled as appropriate, and the light emission of the light emitting element in the pixel circuit is controlled. As a display device drivable by an active matrix system, for example, a display device in which an organic light emitting diode (OLED) is used as a light emitting element (hereinafter, occasionally referred to as an organic electroluminescence (EL) display device) is developed (for example, Patent Literatures 1 to 4).

CITATION LIST

Patent Literature

Patent Literature 1: JP 2015-55763A
Patent Literature 2: JP 2016-53636A
Patent Literature 3: JP 2016-53640A
Patent Literature 4: JP 2016-53641A

DISCLOSURE OF INVENTION

Technical Problem

Here, in a display device, for example, in order to realize a display with higher definition and to mount it in a relatively small-sized electronic apparatus such as a wearable device, pixel size needs to be reduced. When pixel size is reduced, a layout of a pixel circuit is also miniaturized, and thus the following problems may occur. That is, the problems are deterioration of emission luminance uniformity caused by noise interference between electrodes due to an increase in parasitic capacitance between interconnections, deterioration of luminance uniformity caused by deterioration of noise resistance due to the pressure of the area of an electrode of a capacitance element, a failure of a short circuit between interconnections due to a pixel interconnection becoming dense, a failure of interconnection open due to an interconnection pattern having a small area not being formed normally (so-called film skipping), and the like. In order to realize a display device with high definition and higher reliability, it is necessary to suppress the occurrence of these problems.

Consequently, the present disclosure proposes a new and improved display device and electronic apparatus which are capable of further improving reliability.

Solution to Problem

According to the present disclosure, there is provided a display device including a pixel unit which is configured with a plurality of pixel circuits arranged in a matrix, each of the pixel circuits including a light emitting element and a driving circuit for driving the light emitting element, scanning lines which are interconnections connected to the respective pixel circuits and are provided to extend in a first direction and correspond to respective rows of a plurality of the pixel circuits, and signal lines which are interconnections connected to the respective pixel circuits and are provided to extend in a second direction orthogonal to the first direction and correspond to respective columns of a plurality of the pixel circuits, in which one of the scanning lines and the signal lines, provided for the one pixel circuit, which is larger in number is positioned in a lower-level interconnection layer, and an electrode of a capacitance element included in the driving circuit is positioned in the interconnection layer in which either the scanning lines or the signal lines are provided.

In addition, according to the present disclosure, there is also provided an electronic apparatus including a display device which performs display on the basis of a video signal, in which the display device includes a pixel unit which is configured with a plurality of pixel circuits arranged in a matrix, each of the pixel circuits including a light emitting element and a driving circuit for driving the light emitting element, scanning lines which are interconnections connected to the respective pixel circuits and are provided to extend in a first direction and correspond to respective rows of a plurality of the pixel circuits, and signal lines which are interconnections connected to the respective pixel circuits and are provided to extend in a second direction orthogonal to the first direction and correspond to respective columns of a plurality of the pixel circuits, one of the scanning lines and the signal lines, provided for the one pixel circuit, which is larger in number is positioned in a lower-level interconnection layer, and an electrode of a capacitance element included in the driving circuit is positioned in the interconnection layer in which either the scanning lines or the signal lines are provided.

According to the present disclosure, with respect to two types of orthogonal interconnections (scanning lines and signal lines) provided for a pixel unit, one of the two types of interconnections, provided for one pixel circuit, which is larger in number is formed in a lower-level interconnection layer. Therefore, it is possible to make an interconnection pattern in a higher-level interconnection layer relatively sparse. In addition, an electrode of a capacitance element included in the pixel circuit is formed in an interconnection layer in which any one of the two types of interconnections is provided. That is, since the electrode of the capacitance element can be provided in an interconnection layer having a relatively sparse interconnection pattern, it is possible the degree of freedom of arrangement of the electrode is improved and to sufficiently secure the area of the electrode. Therefore, it is possible to solve a problem caused to a relatively dense interconnection pattern, a problem caused by the area of the electrode of the capacitance element which is incapable of being sufficiently secured, and the like. Accordingly, a display device with higher reliability can be realized.

Advantageous Effects of Invention

As described above, according to the present disclosure, it is possible to further improve reliability. Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
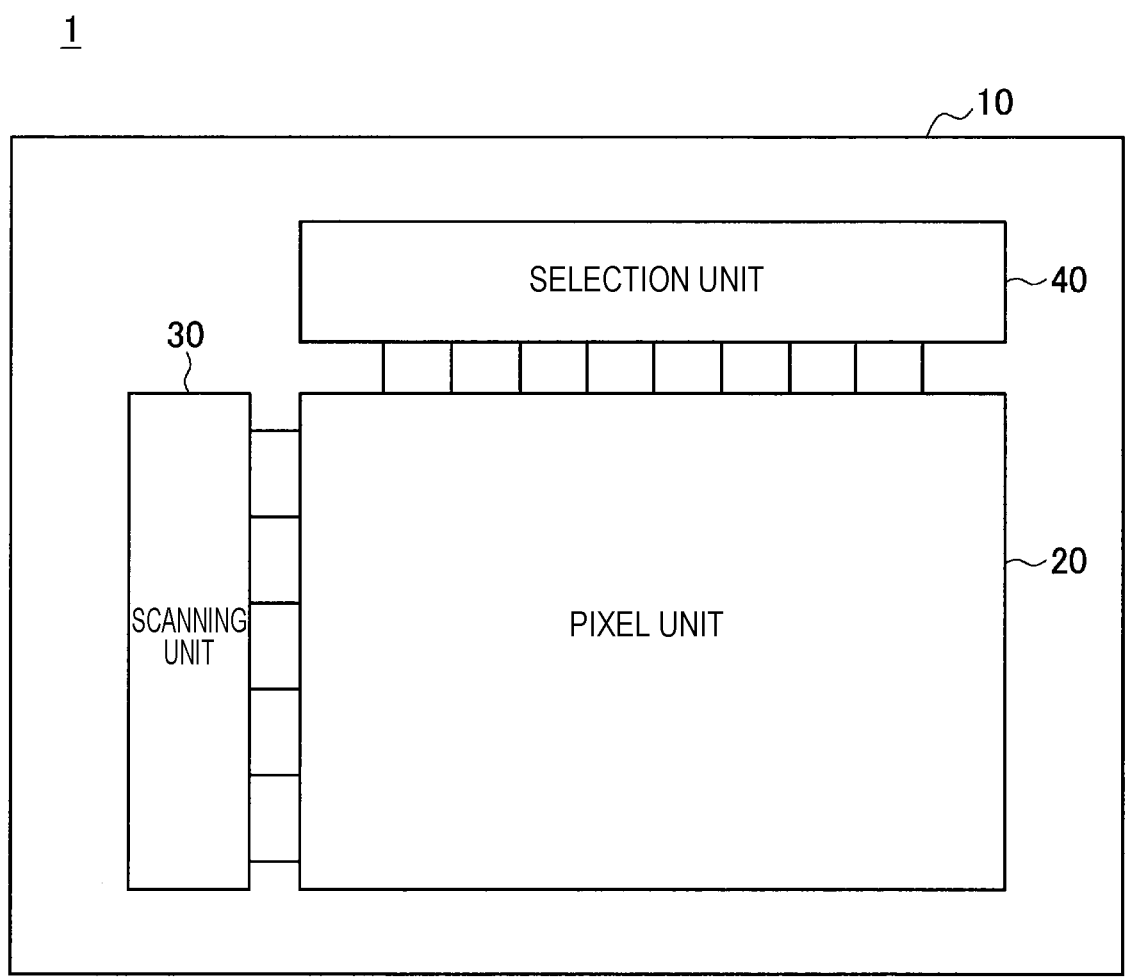
FIG. 1 is a schematic diagram showing an overall configuration of a display device according to the present embodiment.

Hereinafter, (a) preferred embodiment (s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, in the drawings, the sizes etc. of some layers in the cross-sectional view and some areas in the top view showing a layout may be expressed exaggeratedly for the sake of description. The relative sizes of layers, areas, etc. shown in the drawings do not necessarily express the actual magnitude relationships between layers, areas, etc. accurately.

Further, in the following, an embodiment in which the display device is an organic EL display device is described as an example of the present disclosure. However, the present disclosure is not limited to this example, and the display device that is an object of the present disclosure may be various display devices as long as they are display devices drivable by an active matrix-type driving system.

Figure 2:
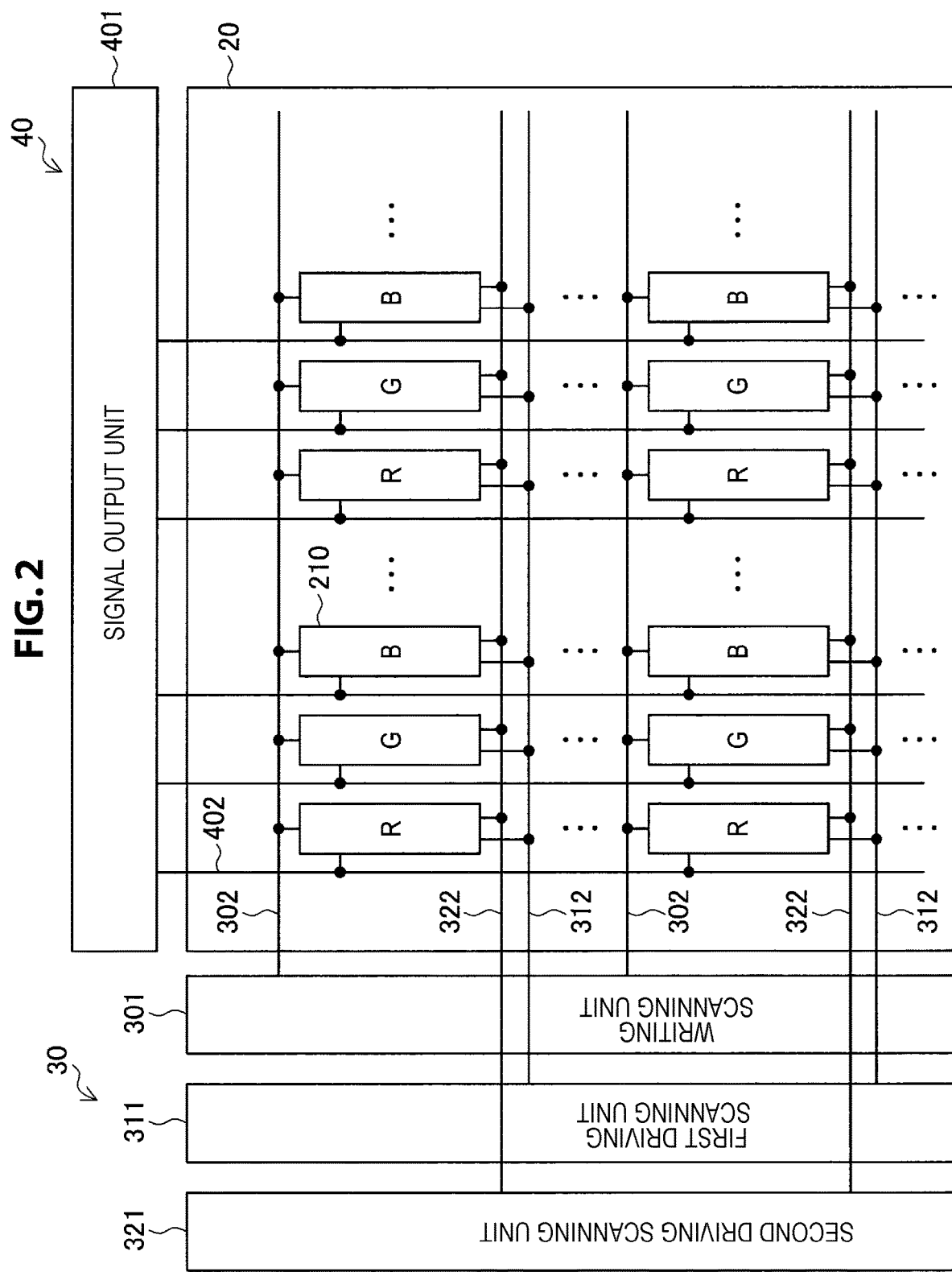
FIG. 2 is a schematic diagram showing a configuration of a pixel unit, a scanning unit, and a selection unit shown in FIG. 1, in more detail.

Note that the description is given in the following order.
1. Overall configuration of display device
2. Configuration of pixel circuit
3. Operation of pixel circuit
4. Layout of interconnection layer
5. Specific configuration example of display device
6. Application examples
7. Supplement 1. Overall Configuration of Display Device An overall configuration of a display device according to an embodiment of the present disclosure will now be described with reference to FIGS. 1 and 2. FIG. 1 is a schematic diagram showing an overall configuration of a display device according to the present embodiment. FIG. 2 is a schematic diagram showing the configuration of a pixel unit, a scanning unit, and a selection unit shown in FIG. 1, in more detail.

Referring to FIG. 1, in a display device 1 according to the present embodiment, a pixel unit 20, a scanning unit 30, and a selection unit 40 are arranged on a display panel 10. As shown in FIG. 2, in the pixel unit 20, a plurality of pixel circuits 210 are arranged in a matrix form. Note that, although written as the pixel circuit 210 for the sake of convenience, "the pixel circuit 210" shown in FIG. 2 shows a portion excluding an interconnection layer of the pixel circuit 210; in practice, in the pixel circuit 210, interconnections (interconnections extending from the scanning unit 30 and the selection unit 40, a power supply line 332, etc. described later) may be connected to "the pixel circuit 210" shown in FIG. 2. That is, these interconnections may be provided in common to a plurality of pixel circuits 210, but they can also be parts of the pixel circuit 210; thus, in FIG. 2, a portion excluding the interconnection layer of the pixel circuit 210 is shown as the pixel circuit 210 for the sake of convenience. In the present specification, in a case of being written as "the pixel circuit 210," this component may thus refer to only a portion excluding the interconnection layer of the pixel circuit 210 for the sake of convenience.

One pixel circuit 210 corresponds to one sub-pixel. Here, the display device 1 is a display device capable of color display, and one pixel serving as a unit that forms a color image includes a plurality of sub-pixels. Specifically, one pixel includes three sub-pixels of a sub-pixel that emits red light, a sub-pixel that emits green light, and a sub-pixel that emits blue light. In FIG. 2, a color (R, G, or B) corresponding to each sub-pixel is simulatively written in each pixel circuit 210. Light emission in each pixel circuit 210 (that is, each sub-pixel) is controlled as appropriate, and thereby a desired image is displayed in the pixel unit 20. Thus, the pixel unit 20 corresponds to a display surface in the display device 1.

However, in the present embodiment, the combination of sub-pixels included in one pixel is not limited to a combination of sub-pixels of three primary colors of RGB. For example, in one pixel, sub-pixels of one color or a plurality of colors may further be added to sub-pixels of three primary colors. Specifically, for example, in one pixel, a sub-pixel that emits white light may be added to sub-pixels of three primary colors in order to improve the luminance; or in one pixel, at least one sub-pixel that emits light of a complementary color may be added to sub-pixels of three primary colors in order to expand the color reproduction range. Alternatively, in the display device 1, a sub-pixel may not exist, and one pixel circuit 210 may correspond to one pixel. Furthermore, alternatively, the display device 1 may not be one capable of color display, and may be one that performs monochrome display.

The scanning unit 30 is placed on one side in the horizontal direction of the pixel unit 20. A plurality of interconnections that are provided to be arranged in the vertical direction extend in the horizontal direction from the scanning unit 30 toward the pixel unit 20. Specifically, as shown in FIG. 2, the scanning unit 30 includes a writing scanning unit 301, a first driving scanning unit 311, and a second driving scanning unit 321. A plurality of writing scanning lines 302 extend from the writing scanning unit 301 toward the respective rows of the pixel circuits 210, a plurality of first driving lines 312 extend from the first driving scanning unit 311 toward the respective rows of the pixel circuits 210, and a plurality of second driving lines 322 extend from the second driving scanning unit 321 toward the respective rows of the pixel circuits 210. Each of the plurality of interconnections (the writing scanning lines 302, the first driving lines 312, and the second driving lines 322) is connected to the respective pixel circuits 210. The writing scanning unit 301, the first driving scanning unit 311, and the second driving scanning unit 321 change the electric potentials of these plurality of interconnections as appropriate, and thereby control the operation of each pixel circuit 210 so that a desired image can be displayed as the entire display surface. Details of the connection state between the writing scanning line 302, the first driving line 312, and the second driving line 322, and the pixel circuit 210, and functions of the writing scanning unit 301, the first driving scanning unit 311, and the second driving scanning unit 321 are described later with reference to FIG. 3.

The selection unit 40 is placed on one side in the vertical direction of the pixel unit 20. A plurality of interconnections that are provided to be arranged in the horizontal direction extend in the vertical direction from the selection unit 40 toward the pixel unit 20. Specifically, as shown in FIG. 2, the selection unit 40 includes a signal output unit 401. A plurality of signal lines 402 extend from the signal output unit 401 toward the respective columns of the pixel circuits 210. Each of the plurality of signal lines 402 is connected to the respective pixel circuits 210 in the pixel unit 20. The signal output unit 401 changes the electric potentials of the plurality of signal lines 402 as appropriate, and thereby controls the operation of each pixel circuit 210 so that a desired image can be displayed as the entire display surface. Details of the connection state between the signal line 402 and the pixel circuit 210, and functions of the signal output unit 401 are described later with reference to FIG. 3.

Thus, interconnections extending in the horizontal direction from the scanning unit 30 are provided to correspond to the respective rows of the pixel circuits 210 arranged in a matrix form, and are connected to the respective pixel circuits 210. Further, interconnections extending in the vertical direction from the selection unit 40 are provided to correspond to the respective columns of the pixel circuits 210 arranged in a matrix form, and are connected to the respective pixel circuits 210. Then, the electric potentials of the plurality of interconnections are changed by the scanning unit 30 and the selection unit 40 as appropriate, and thereby the operation of each pixel circuit 210 of the pixel unit 20 is controlled.

2. Configuration of Pixel Circuit

Figure 3:
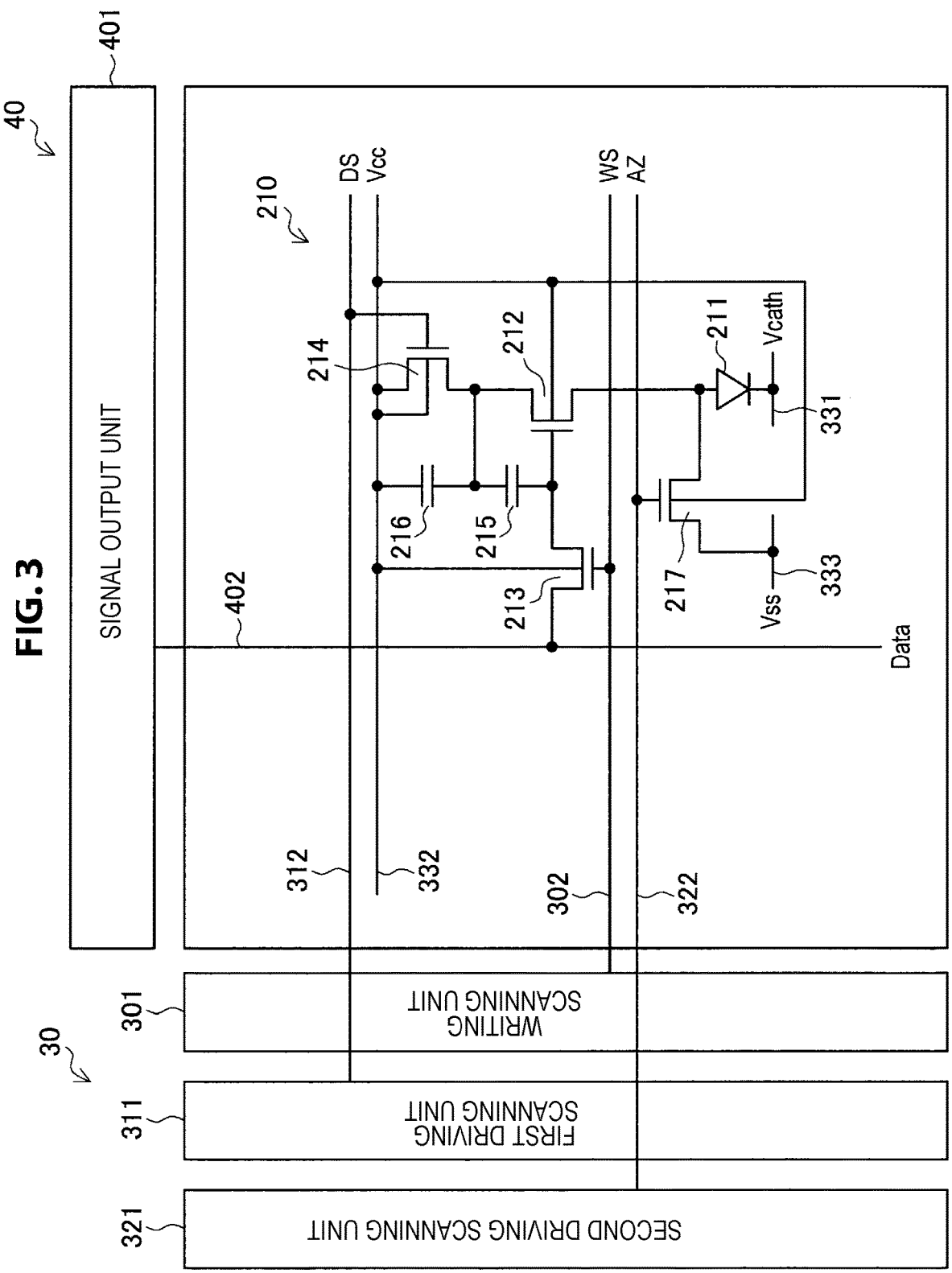
FIG. 3 is a schematic diagram showing a configuration example of a pixel circuit shown in FIG. 2.

The configuration of the pixel circuit 210 shown in FIG. 2 will now be described with reference to FIG. 3. FIG. 3 is a schematic diagram showing the configuration of the pixel circuit 210 shown in FIG. 2. FIG. 3 shows a circuit configuration of one pixel circuit 210 among the plurality of pixel circuits 210 shown in FIG. 2, and shows the connection state with respect to the pixel circuit 210 of the writing scanning line 302, the first driving line 312, the second driving line 322, and the signal line 402.

As shown in FIG. 3, the pixel circuit 210 includes an organic light emitting diode 211 that is a light emitting element and a driving circuit that drives the organic light emitting diode 211 by passing a current through the organic light emitting diode 211. The driving circuit includes four transistors that are active elements (a driving transistor 212, a sampling transistor 213, a light emission control transistor 214, and a switching transistor 217) and capacitance elements (a holding capacitance 215 and an auxiliary capacitance 216). In the pixel circuit 210, interconnections (the writing scanning line 302, the first driving line 312, the second driving line 322, and the signal line 402 mentioned above, a power supply line 332 described later, etc.) are connected to these elements.

Note that an organic light emitting diode having an ordinary structure may be used as the organic light emitting diode 211. Further, each of the driving transistor 212, the sampling transistor 213, the light emission control transistor 214, and the switching transistor 217 is a P-channel four-terminal (source/gate/drain/back gate) transistor formed on a semiconductor such as silicon (Si), and the structure may be similar to an ordinary P-channel four-terminal transistor. Therefore, a detail description of the structures of the organic light emitting diode 211, the driving transistor 212, the sampling transistor 213, the light emission control transistor 214, and the switching transistor 217 is omitted herein.

The cathode of the organic light emitting diode 211 is connected to a common power supply line 331 (electric potential: $V_{CATH}$) that is provided in common to all the pixel circuits 210 of the pixel unit 20. The drain electrode of the driving transistor 212 is connected to the anode of the organic light emitting diode 211.

The drain electrode of the light emission control transistor 214 is connected to the source electrode of the driving transistor 212, and the source electrode of the light emission control transistor 214 is connected to a power supply line 332 (electric potential: $V_{cc}$; $V_{cc}$ being the power supply potential). Further, the gate electrode of the driving transistor 212 is connected to the drain electrode of the sampling transistor 213, and the source electrode of the sampling transistor 213 is connected to the signal line 402.

Therefore, by the sampling transistor 213 being brought into a conduction state, an electric potential corresponding to the electric potential of the signal line 402 is applied to the gate electrode of the driving transistor 212 (the electric potential of the signal line 402 is written), and the driving transistor 212 is brought into a conduction state. Further, in this event, by the light emission control transistor 214 being brought into a conduction state, an electric potential corresponding to the signal potential $V_{cc}$ is applied to the source electrode of the driving transistor 212, and a drain-source current $I_{ds}$ is generated in the driving transistor 212; thus, the organic light emitting diode 211 is driven. In this event, the magnitude of the drain-source current $I_{ds}$ changes in accordance with the gate potential $V_g$ of the driving transistor 212, and therefore the emission luminance of the organic light emitting diode 211 is controlled in accordance with the gate potential $V_g$ of the driving transistor 212, that is, the electric potential of the signal line 402 written by the sampling transistor 213.

Thus, the driving transistor 212 has the function of causing the organic light emitting diode 211 to be driven by the drain-source current $I_{ds}$ of the driving transistor 212. Further, the sampling transistor 213 controls the gate voltage of the driving transistor 212 in accordance with the electric potential of the signal line 402, that is, controls the on/off of the driving transistor 212; thus, the sampling transistor 213 has the function of writing the electric potential of the signal line 402 on the pixel circuit 210 (that is, has the function of sampling a pixel circuit 210 to write the electric potential of the signal line 402 on). Further, the light emission control transistor 214 controls the electric potential of the source electrode of the driving transistor 212, and thereby controls the drain-source current $I_{ds}$ of the driving transistor 212; thus, the light emission control transistor 214 has the function of controlling the light emission/non-light emission of the organic light emitting diode 211.

The holding capacitance 215 is connected between the gate electrode of the driving transistor 212 (that is, the drain electrode of the sampling transistor 213) and the source electrode of the driving transistor 212. That is, the holding capacitance 215 holds the gate-source voltage $V_{gs}$ of the driving transistor 212. The auxiliary capacitance 216 is connected between the source electrode of the driving transistor 212 and the power supply line 332. The auxiliary capacitance 216 has the action of suppressing the source potential of the driving transistor 212 varying when the electric potential of the signal line 402 is written.

The signal output unit 401 controls the electric potential of the signal line 402 (a signal line voltage Date) as appropriate, and thereby writes the electric potential of the signal line 402 on the pixel circuit 210 (specifically, as described above, the electric potential of the signal line 402 is written on a pixel circuit 210 selected by the sampling transistor 213). In the present embodiment, the signal output unit 401 selectively outputs a signal voltage $V_{sig}$ corresponding to a video signal, a first reference voltage $V_{ref}$, and a second reference voltage $V_{ofs}$ via the signal line 402. Here, the first reference voltage $V_{ref}$ is a reference voltage for causing the organic light emitting diode 211 to be extinguished reliably. Further, the second reference voltage $V_{ofs}$ is a voltage serving as a reference of the signal voltage $V_{sig}$ corresponding to a video signal (for example, a voltage equivalent to the black level of a video signal), and is used when performing a threshold correction operation described later.

The writing scanning line 302 is connected to the gate electrode of the sampling transistor 213. The writing scanning unit 301 controls the on/off of the sampling transistor 213 by changing the electric potential of the writing scanning line 302 (a scanning line voltage WS), and executes the processing of writing the electric potential of the signal line 402 described above (for example, the signal voltage $V_{sig}$ corresponding to a video signal) on the pixel circuit 210. In practice, as described with reference to FIG. 2, a plurality of writing scanning lines 302 are extended to the respective rows of a plurality of pixel circuits 210 arranged in a matrix form. When writing the electric potential of the signal line 402 on each pixel circuit 210, the writing scanning unit 301 sequentially supplies the scanning line voltage WS of a prescribed value to the plurality of writing scanning lines 302, and thereby scans the pixel circuits 210 on a row basis one after another.

Note that, also for the signal line 402, in practice a plurality of signal lines 402 are extended to the respective columns of a plurality of pixel circuits 210 arranged in a matrix form, as described with reference to FIG. 2. The signal voltage $V_{sig}$ corresponding to a video signal, the first reference voltage $V_{ref}$, and the second reference voltage $V_{ofs}$, which are alternatively outputted from the signal output unit 401, are written on the pixel circuits 210 via the plurality of signal lines 402, in units of pixel rows selected by scanning by the writing scanning unit 301. That is, the signal output unit 401 writes the electric potential of the signal line 402 on a row basis.

The first driving line 312 is connected to the gate electrode of the light emission control transistor 214. The first driving scanning unit 311 controls the on/off of the light emission control transistor 214 by changing the electric potential of the first driving line 312 (a first driving line voltage DS), and executes the processing of controlling the light emission/non-light emission of the organic light emitting diode 211 described above. In practice, as described with reference to FIG. 2, a plurality of first driving lines 312 are extended to the respective rows of a plurality of pixel circuits 210 arranged in a matrix form. In synchronization with scanning by the writing scanning unit 301, the first driving scanning unit 311 sequentially supplies the first driving line voltage DS of a prescribed value to the plurality of first driving lines 312, and thereby controls the light emission/non-light emission of each pixel circuit 210 as appropriate.

Here, further, in the pixel circuit 210, the source electrode of the switching transistor 217 is connected to the anode of the organic light emitting diode 211. The drain electrode of the switching transistor 217 is connected to a ground line 333 (electric potential: $V_{ss}$; $V_{ss}$ being the ground potential). A current flowing through the driving transistor 212 during the non-light emission period of the organic light emitting diode 211 flows through the ground line 333 by means of a current path formed by the switching transistor 217.

Here, as described later, when driving the pixel circuit 210 according to the present embodiment, a threshold correction operation that corrects the threshold voltage $V_{th}$ of the driving transistor 212 is performed, and further a threshold correction preparation operation is performed as a pre-stage for performing the threshold correction operation. In the threshold correction preparation operation, an operation that initializes the gate potential $V_g$ and the source potential $V_s$ of the driving transistor 212 is performed, and consequently the gate-source voltage $V_{gs}$ of the driving transistor 212 becomes larger than the threshold voltage $V_{th}$ of the driving transistor 212. This is because, if the gate-source voltage $V_{gs}$ of the driving transistor 212 is not set larger than the threshold voltage $V_{th}$ of the driving transistor 212, the threshold correction operation cannot be performed properly.

Therefore, if the operation that initializes the gate potential $V_g$ and the source potential $V_s$ of the driving transistor 212 mentioned above is performed, a situation where the anode potential $V_{ano}$ of the organic light emitting diode 211 exceeds the threshold voltage $V_{thel}$ of the organic light emitting diode 211 in spite of the non-light emission period of the organic light emitting diode 211 may occur. Consequently, a current flows into the organic light emitting diode 211 from the driving transistor 212, and a phenomenon in which the organic light emitting diode 211 emits light in spite of the non-light emission period occurs.

Thus, in the present embodiment, a current circuit using the switching transistor 217 described above is provided in order to prevent such a phenomenon. Thereby, the current from the driving transistor 212 mentioned above does not flow into the organic light emitting diode 211 but flows into this current circuit, and unintentional light emission of the organic light emitting diode 211 can be prevented.

The second driving line 322 is connected to the gate electrode of the switching transistor 217. The second driving scanning unit 321 controls the on/off of the switching transistor 217 by changing the electric potential of the second driving line 322 (a second driving line voltage AZ). Specifically, the second driving scanning unit 321 changes the second driving line voltage AZ as appropriate, and thereby sets the switching transistor 217 in a conduction state and opens the current circuit described above during a light-emission-receiving period, more specifically, at least during a period in which the gate-source voltage $V_{gs}$ of the driving transistor 212 is set larger than the threshold voltage $V_{th}$ of the driving transistor 212 by performing the threshold correction preparation operation. In practice, as described with reference to FIG. 2, a plurality of second driving lines 322 are extended to the respective rows of a plurality of pixel circuits 210 arranged in a matrix form. The second driving scanning unit 321 sequentially supplies the second driving line voltage AZ of a prescribed value to the plurality of second driving lines 322 in synchronization with scanning by the writing scanning unit 301, and thereby controls the driving of the switching transistor 217 so that the switching transistor 217 is in a conduction state during the period mentioned above, as appropriate.

Note that the writing scanning unit 301, the first driving scanning unit 311, the second driving scanning unit 321, and the signal output unit 401 can be obtained using known techniques by means of various circuits capable of achieving the functions described above, such as a shift register circuit, and therefore a description of detailed circuit configurations of these units is omitted herein.

Hereinabove, the configuration of the pixel circuit 210 according to the present embodiment is described.

3. Operation of Pixel Circuit

Figure 4:
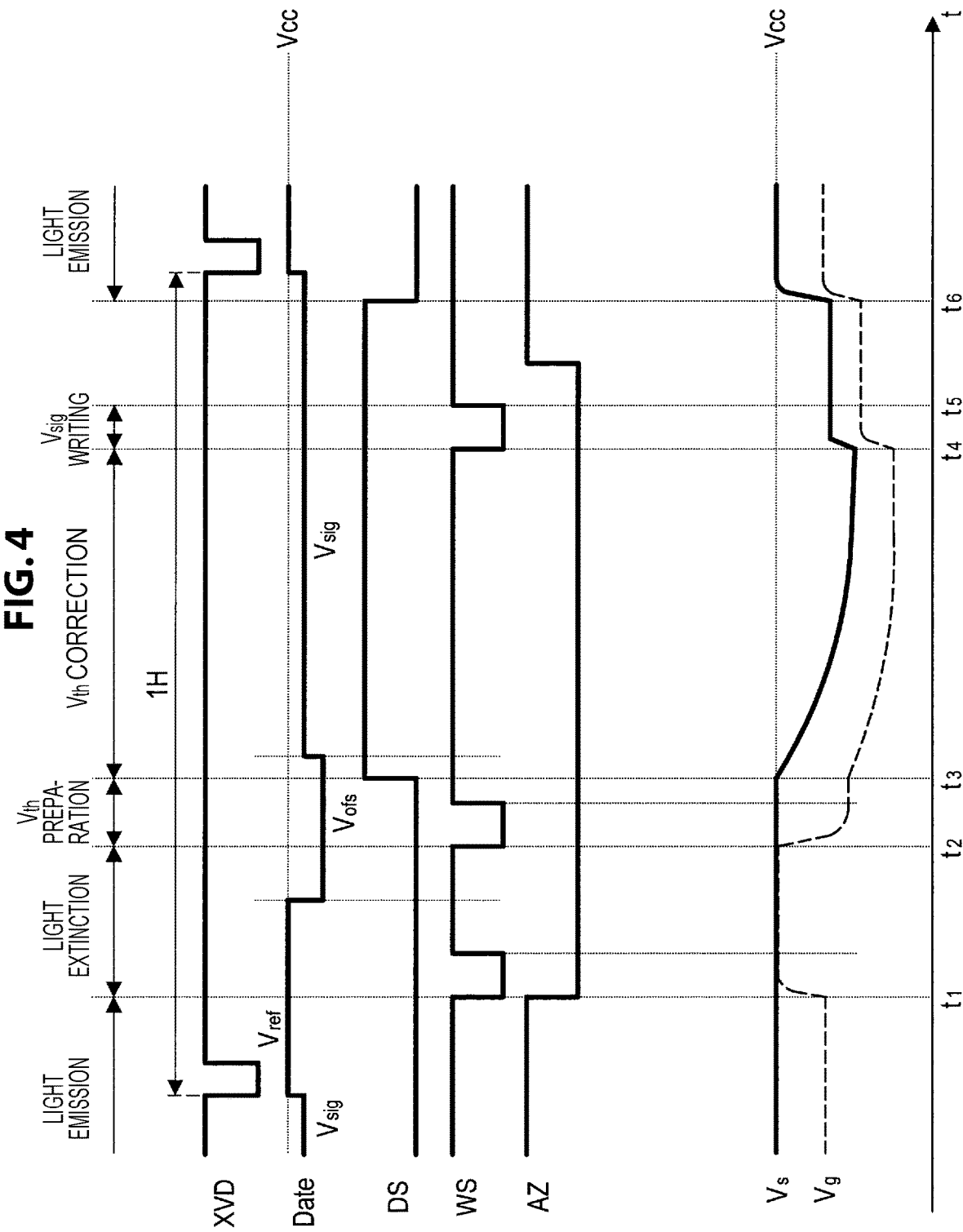
FIG. 4 is a diagram for describing operation of the pixel circuit according to the present embodiment.

The operation of the pixel circuit 210 described hereinabove will now be described. FIG. 4 is a diagram for describing the operation of the pixel circuit 210 according to the present embodiment. FIG. 4 shows a timing waveform diagram of signals related to the operation of the pixel circuit 210. Specifically, FIG. 4 shows manners of changes in one horizontal period (one H-period) of the electric potential of the signal line 402 (the signal line voltage Date), the electric potential of the writing scanning line 302 (the scanning line voltage WS), the electric potential of the first driving line 312 (the first driving line voltage DS), the electric potential of the second driving line 322 (the second driving line voltage AZ), the source potential $V_s$ of the driving transistor 212, and the gate potential $V_g$ of the driving transistor 212.

It is noted that, since each of the sampling transistor 213, the light emission control transistor 214, and the switching transistor 217 is of a P-channel type, these transistors are in an ON state, that is, a conduction state when the scanning line voltage WS, the first driving line voltage DS, and the second driving line voltage AZ are in a low electric potential state, respectively, and these transistors are in an off state, that is, a non-conduction state when the scanning line voltage WS, the first driving line voltage DS, and the second driving line voltage AZ are in a high electric potential state, respectively. Also for the driving transistor 212, similarly, the driving transistor 212 is in a conduction state in a case where the gate potential $V_g$ is a low electric potential, and the driving transistor 212 is in a non-conduction state in a case where the gate potential $V_g$ is a high electric potential. Further, as described above, any of the signal voltage $V_{sig}$ corresponding to a video signal, the first reference voltage $V_{ref}$, and the second reference voltage $V_{ofs}$ is alternatively selected for the signal line voltage Date. In the waveform diagram shown in FIG. 4, $V_{ref}=V_{cc}$ (the power supply potential), as an example.

At the time of the ending of a light emission period of the organic light emitting diode 211, the scanning line voltage WS transitions from a high electric potential to a low electric potential, and the sampling transistor 213 is brought into a conduction state (time $t_1$). On the other hand, at time $t_1$, the signal line voltage Date is in a state of being controlled to the first reference voltage $V_{ref}$. Therefore, by the transition of the scanning line voltage WS from a high electric potential to a low electric potential, the gate-source voltage $V_{gs}$ of the driving transistor 212 becomes less than or equal to the threshold voltage $V_{th}$ of the driving transistor 212, and thus the driving transistor 212 is cut off. If the driving transistor 212 is cut off, the path of current supply to the organic light emitting diode 211 is cut off, and therefore the anode potential $V_{ano}$ of the organic light emitting diode 211 decreases gradually. With time, if the anode potential $V_{ano}$ becomes less than or equal to the threshold voltage $V_{thel}$ of the organic light emitting diode 211, the organic light emitting diode 211 enters a light extinction state completely (the period of time $t_1$ to time $t_2$; a light extinction period).

Subsequently to the light extinction period, a period in which a preparation operation (a threshold correction preparation operation) before performing a threshold correction operation described later is performed is provided (the period of time $t_2$ to time $t_3$; a threshold correction preparation period). Specifically, at time $t_2$, which is a timing at which the threshold correction preparation period is started, the scanning line voltage WS transitions from a high electric potential to a low electric potential, and thereby the sampling transistor 213 enters a conduction state. On the other hand, at time $t_2$, the signal line voltage Date is in a state of being controlled to the second reference voltage $V_{ofs}$. By the sampling transistor 213 entering a conduction state in a state where the signal line voltage Date is the second reference voltage $V_{ofs}$, the gate potential $V_g$ of the driving transistor 212 becomes the second reference voltage $V_{ofs}$.

Further, at time $t_2$, the first driving line voltage DS is in a low electric potential state, and the light emission control transistor 214 is set in a conduction state. Therefore, the source potential $V_s$ of the driving transistor 212 is the power supply voltage $V_{cc}$. In this event, the gate-source voltage $V_{gs}$ of the driving transistor 212 is $V_{gs}=V_{ofs}-V_{cc}$.

Here, to perform the threshold correction operation, it is necessary that the gate-source voltage $V_{gs}$ of the driving transistor 212 be set larger than the threshold voltage $V_{th}$ of the driving transistor 212. Hence, each voltage value is set such that $|V_g|=|V_{ofs}-V_{cc}|>|V_{th}|$.

Thus, the initialization operation that sets the gate potential $V_g$ of the driving transistor 212 to the second reference voltage $V_{ofs}$ and sets the source potential $V_s$ of the driving transistor 212 to the power supply voltage $V_{cc}$ is the threshold correction preparation operation. That is, the second reference voltage $V_{ofs}$ and the power supply voltage $V_{cc}$ are the initialization voltages of the gate potential $V_g$ and the source potential $V_s$ of the driving transistor 212, respectively.

If the threshold correction preparation period ends, next, the threshold correction operation that corrects the threshold voltage $V_{th}$ of the driving transistor 212 is performed (the period of time $t_3$ to time $t_4$; a threshold correction period). In the period in which the threshold correction operation is performed, first, at time $t_3$, which is the timing at which the threshold correction period is started, the first driving line voltage DS transitions from a low electric potential to a high electric potential, and the light emission control transistor 214 enters a non-conduction state. Thereby, the source potential $V_s$ of the driving transistor 212 enters a floating state. On the other hand, at time $t_3$, the scanning line voltage WS is in a state of being controlled to a high electric potential, and the sampling transistor 213 is in a non-conduction state. Therefore, at time $t_3$, also the gate potential $V_g$ of the driving transistor 212 is in a floating state, and the source electrode and the gate electrode of the driving transistor 212 enter a state of being connected together via the holding capacitance 215, in a state of floating with each other. Thereby, as illustrated, the source potential $V_s$ and the gate potential $V_g$ of the driving transistor 212 gradually change to prescribed values in accordance with the threshold voltage $V_{th}$ of the driving transistor 212.

Thus, the operation that, using the initialization voltage $V_{ofs}$ of the gate potential $V_g$ of the driving transistor 212 and the initialization voltage $V_{cc}$ of and the source potential $V_s$ of the driving transistor 212 as references, changes the source potential $V_s$ and the gate potential $V_g$ of the driving transistor 212 to prescribed values in accordance with the threshold voltage $V_{th}$ of the driving transistor 212, in a floating state, is the threshold correction operation. If the threshold correction operation progresses, the gate-source voltage $V_{gs}$ of the driving transistor 212 stabilizes to the threshold voltage $V_{th}$ of the driving transistor 212 with time. A voltage equivalent to the threshold voltage $V_{th}$ is held in the holding capacitance 215.

Here, as a matter of course, a design value exists for the threshold voltage $V_{th}$ of the driving transistor 212; however, due to manufacturing variations etc., the actual threshold voltage $V_{th}$ does not always coincide with the design value. In this regard, by performing a threshold correction operation like the above, a voltage equivalent to the actual threshold voltage $V_{th}$ can be caused to be held in the holding capacitance 215 before the organic light emitting diode 211 is caused to emit light. Thereby, after that, when causing the driving transistor 212 to be driven in order to cause the organic light emitting diode 211 to emit light, a variation in the threshold voltage $V_{th}$ of the driving transistor 212 can be canceled, as described later. Therefore, the driving of the driving transistor 212 can be controlled with better precision, and a desired luminance can be obtained more favorably.

If the threshold correction period ends, next, a signal writing operation that writes the signal voltage $V_{sig}$ corresponding to a video signal is performed (the period of time $t_4$ to time $t_5$: a signal writing period). In the signal writing period, at time $t_4$, which is the timing at which the signal writing period is started, the scanning line voltage WS transitions from a high electric potential to a low electric potential, and the sampling transistor 213 is brought into a conduction state. On the other hand, at time $t_4$, the signal line voltage Date is in a state of being controlled to the signal voltage $V_{sig}$ in accordance with a video signal, and therefore the signal voltage $V_{sig}$ in accordance with a video signal is written on the holding capacitance 215. When writing the signal voltage $V_{sig}$ corresponding to a video signal, the auxiliary capacitance 216 connected between the source electrode of the driving transistor 212 and the power supply line 332 plays the role of suppressing the variation in the source potential $V_s$ of the driving transistor 212. Then, at the time when the signal voltage $V_{sig}$ in accordance with a video signal is written, that is, at the time when the signal voltage $V_{sig}$ in accordance with a video signal is applied to the gate electrode of the driving transistor 212 and the driving transistor 212 is driven, the threshold voltage $V_{th}$ of the driving transistor 212 is canceled by the voltage equivalent to the threshold voltage $V_{th}$ that is held in the holding capacitance 215 as a result of the threshold correction operation. That is, by having performed the threshold correction operation mentioned above, the variation in the threshold voltage $V_{th}$ of the driving transistor 212 between pixel circuits 210 is canceled.

At time $t_5$, the scanning line voltage WS transitions from a low electric potential to a high electric potential, and the sampling transistor 213 is brought into a non-conduction state; thereby, the signal writing period ends. If the signal writing period ends, next, a light emission period is started from time $t_6$. At time $t_6$, which is the timing at which the light emission period is started, the first driving line voltage DS transitions from a high electric potential to a low electric potential, and thereby the light emission control transistor 214 is brought into a conduction state. Thus, a current is supplied from the power supply line 332 having the power supply voltage $V_{cc}$ to the source electrode of the driving transistor 212 via the light emission control transistor 214.

In this event, due to the fact that the sampling transistor 213 is in a non-conduction state, the gate electrode of the driving transistor 212 is electrically separated from the signal line 402, and is in a floating state. When the gate electrode of the driving transistor 212 is in a floating state, the holding capacitance 215 is connected between the gate and the source of the driving transistor 212, and thereby the gate potential $V_g$ varies in conjunction with the variation in the source potential $V_s$ of the driving transistor 212. That is, the source potential $V_s$ and the gate potential $V_g$ of the driving transistor 212 rise while holding the gate-source voltage $V_{gs}$ held in the holding capacitance 215. Then, the source potential $V_s$ of the driving transistor 212 rises up to a light emission voltage $V_{oled}$ of the organic light emitting diode 211 in accordance with the saturation current of the transistor.

The operation in which the gate potential $V_g$ of the driving transistor 212 varies in conjunction with the variation in the source potential $V_s$ in this way is referred to as a bootstrap operation. In other words, the bootstrap operation is an operation in which the gate potential $V_g$ and the source potential $V_s$ of the driving transistor 212 vary while holding the gate-source voltage $V_{gs}$ held in the holding capacitance 215, that is, the voltage between both ends of the holding capacitance 215.

Then, the drain-source current $I_{ds}$ of the driving transistor 212 begins to flow through the organic light emitting diode 211, and thereby the anode potential $V_{ano}$ of the organic light emitting diode 211 rises in accordance with the drain-source current $I_{ds}$. With time, if the anode potential $V_{ano}$ of the organic light emitting diode 211 exceeds the threshold voltage $V_{thel}$ of the organic light emitting diode 211, a driving current begins to flow through the organic light emitting diode 211, and the organic light emitting diode 211 starts light emission.

The operations described hereinabove are executed in each pixel circuit 210 within one H-period. Note that, as described above, the switching transistor 217 is one for preventing unintentional light emission of the organic light emitting diode 211 that occurs due to a current flowing from the driving transistor 212 toward the organic light emitting diode 211 in the non-light emission period; hence, the second driving line voltage AZ is controlled so that the switching transistor 217 is in a conduction state in the non-light emission period, as appropriate. In the shown example, at time $t_1$ at which a light emission period ends, the second driving line voltage AZ transitions from a high electric potential to a low electric potential; and immediately before time $t_6$ at which the next light emission period is ended or started, the second driving line voltage AZ transitions from a low electric potential to a high electric potential.

Note that, in regard to the overall configuration of the display device 1, the configuration of the pixel circuit 210, and the operation of the pixel circuit 210 according to the present embodiment described hereinabove, WO 2014/103500, which is a prior application by the present applicant, may be referred to except for the respects described later in (4. Layout of interconnection layer) below. In other words, the overall configuration of the display device 1, the configuration of the pixel circuit 210, and the operation of the pixel circuit 210 according to the present embodiment may be similar to those described in WO 2014/103500 except for the respects described later in (4. Layout of interconnection layer) below. However, what is described hereinabove is only an example, and the present embodiment is not limited to this example. It is sufficient that the respects described later in (4. Layout of interconnection layer) below be reflected in the display device 1 according to the present embodiment, and various known configurations used in ordinary display devices may be used for the other respects.

Figure 5:
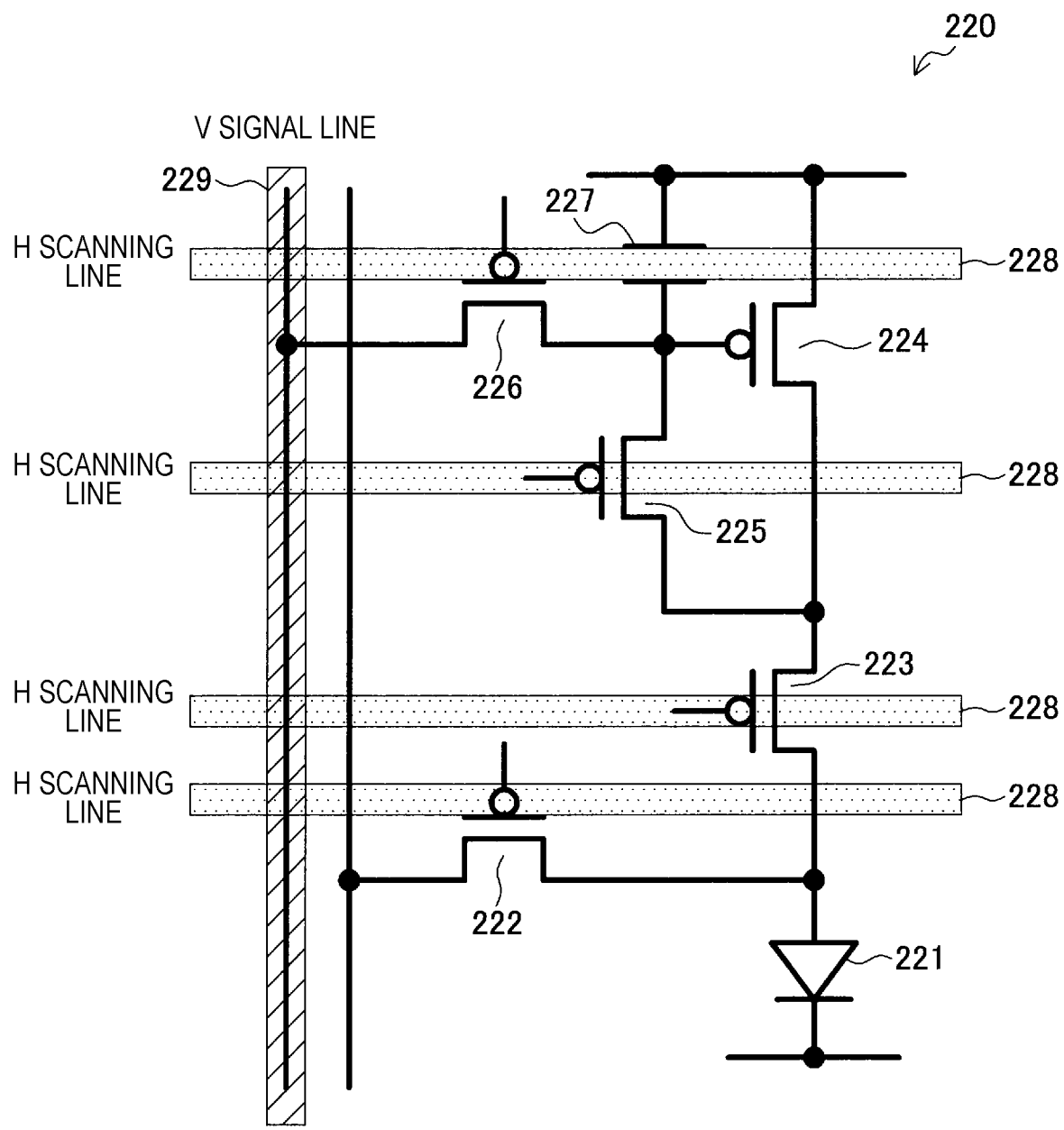
FIG. 5 is a schematic diagram showing another configuration example of the pixel circuit according to the present embodiment.

For example, in the above-described configuration example, the pixel circuit 210 includes four transistors, but a configuration of the pixel circuit 210 is not limited to such an example. Another configuration example of a pixel circuit applicable to the display device 1 is shown in FIG. 5. FIG. 5 is a schematic diagram showing another configuration example of the pixel circuit according to the present embodiment.

Referring to FIG. 5, the pixel circuit 220 includes an organic light emitting diode 221, five transistors 222, 223, 224, 225, and 226, and one holding capacitance 227. A configuration and operation of the pixel circuit 220 are the same as a configuration and operation of a general pixel circuit including five transistors, and thus a detailed description thereof will be omitted here. In this manner, in the present embodiment, various known configurations may be applied as a configuration of a pixel circuit.

4. Layout of Interconnection Layer

Each of the above-described pixel circuits 210 and 220 is configured by stacking a plurality of interconnection layers (metal layers) having interconnections formed therein in an upper layer of a diffusion layer having transistors formed therein and further forming the organic light emitting diode 211 in the upper layer thereof. A layout of an interconnection layer in each of the pixel circuits 210 and 220 will be described. Here, as an example, a layout of an interconnection layer in the pixel circuit 220 shown in FIG. 5 will be described.

Note that, although the detailed description is omitted above, an interconnection extending in the horizontal direction is connected to a gate electrode of each transistor (transistors 222, 223, 225, and 226 in the configuration example shown in FIG. 5) also in the pixel circuit 220, similar to the pixel circuit 210. Although FIG. 5 shows only one pixel circuit 220, these interconnections are actually provided in respective rows of a plurality of pixel circuits 220 arranged in a matrix. In the following description, interconnections provided to extend in the horizontal direction in response to respective rows of a plurality of pixel circuits 220 are also referred to as H scanning lines. As shown in FIG. 5, four H scanning lines 228 are present in one pixel circuit 220 (in FIG. 5, the H scanning lines 228 imitating the actual shapes in the interconnection layer are shown).

In addition, similarly to the pixel circuit 210, also in the pixel circuit 220, interconnections (signal lines) extending in the vertical direction for supplying a signal voltage corresponding to a video signal and the like are connected. Although only one pixel circuit 220 is shown in FIG. 5, the interconnections are actually provided for respective columns of a plurality of pixel circuits 220 arranged in a matrix. In the following description, interconnections provided to extend in the vertical direction in response to respective columns of a plurality of pixel circuits 220 are also referred to as V signal lines. As shown in FIG. 5, one V signal line 229 is present in one pixel circuit 220 (in FIG. 5, the V signal line 229 imitating the actual shape in the interconnection layer is shown).

Figure 6:
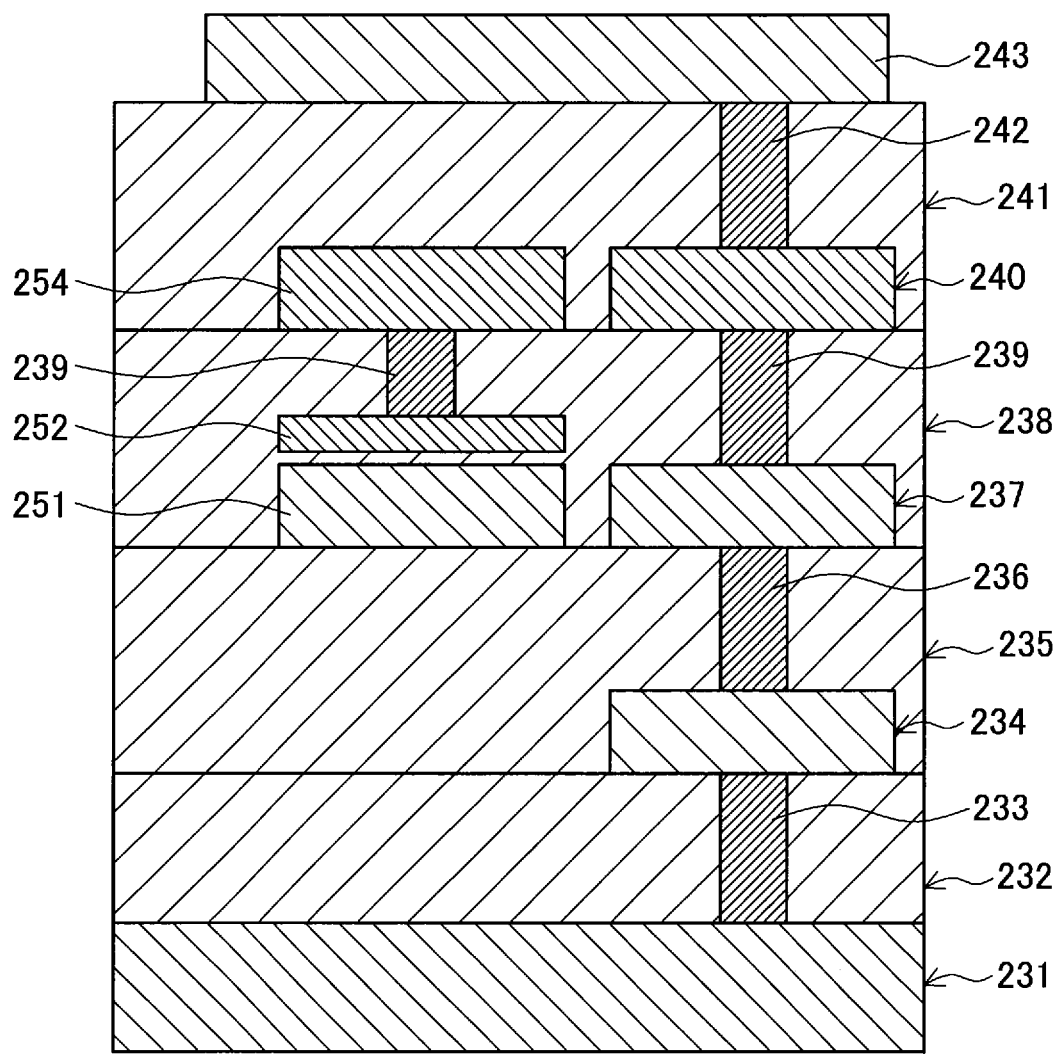
FIG. 6 is a schematic cross-sectional view showing a stacked structure of the pixel circuit.

First, a stacked structure of the pixel circuit 220 will be described with reference to FIG. 6. FIG. 6 is a schematic cross-sectional view showing a stacked structure of the pixel circuit 220. In FIG. 6, a stacked structure from a diffusion layer to an anode of the organic light emitting diode 221 is schematically shown with respect to the pixel circuit 220.

Referring to FIG. 6, the pixel circuit 220 is configured with a plurality of interconnection layers 234, 237, and 240 formed in an upper layer of the diffusion layer 231. In the diffusion layer 231, transistors (the transistors 222 to 226) are formed by forming active regions functioning as a source region, a drain region, and a channel region, a gate insulating film, a gate electrode, and the like on a semiconductor substrate such as Si. Note that, in FIG. 6, elements such as transistors formed in the diffusion layer are not shown for the sake of convenience.

An insulating layer 232 (hereinafter referred to as a first insulating layer 232) is stacked on the diffusion layer 231. The first insulating layer 232 is formed by stacking an insulator such a silicon oxide ($SiO_2$) to a prescribed thickness (the same applies to a second insulating layer 235, a third insulating layer 238, and a fourth insulating layer 241 which will be described later).

In the first insulating layer 232, a contact 233 for electrically connecting a region connected to an interconnection layer of an upper layer such as each electrode (a source electrode, a drain electrode, and a gate electrode) of each transistor of the diffusion layer 231 and an interconnection formed in the first interconnection layer 234 to be described later in the upper layer is formed at a position corresponding to the region. The contact 233 is formed by forming a through hole (contact hole) in the first insulating layer 232 and then embedding a conductor such as tungsten (W) in the contact hole.

The interconnection layer 234 (hereinafter referred to as the first interconnection layer 234) is formed on the first insulating layer 232 in which the contact 233 is formed. The first interconnection layer 234 is formed by stacking a conductor such as aluminum (Al) to a prescribed thickness and then patterning the conductor film into a prescribed shape (the same applies to the second interconnection layer 237 and the third interconnection layer 240 which will be described later). Interconnections (various interconnections including the H scanning line 228 and the V signal line 229) shown in FIG. 5 are formed in the first interconnection layer 234, the second interconnection layer 237, and/or the third interconnection layer 240.

The insulating layer 235 (hereinafter referred to as a second insulating layer 235) is formed on the first interconnection layer 234. A via 236 (hereinafter referred to as a first via 236) for electrically connecting a corresponding interconnection formed in the first interconnection layer 234 of a lower layer and a corresponding interconnection formed in the second interconnection layer 237 to be described later of an upper layer to each other is formed in the second insulating layer 235. The first via 236 is formed by forming a through hole (via hole) in the second insulating layer 235 and then embedding a conductor such as W in the through hole (the same applies to a second via 239 and a third via 242 to be described later).

The interconnection layer 237 (hereinafter referred to as a second interconnection layer 237) is formed on the second insulating layer 235 having the first via 236 formed therein. The insulating layer 238 (hereinafter referred to as a third insulating layer 238) is formed on the second interconnection layer 237. A via 239 (hereinafter referred to as a second via 239) for electrically connecting a corresponding interconnection formed in the second interconnection layer 237 of a lower layer and the third interconnection layer 240 to be described later of an upper layer to each other is formed in the third insulating layer 238.

The interconnection layer 240 (hereinafter referred to as a third interconnection layer 240) is formed on the third insulating layer 238 having the second via 239 formed therein. The insulating layer 241 (hereinafter referred to as a fourth insulating layer 241) is formed on the third interconnection layer 240. A via 242 (hereinafter referred to as a third via 242) for electrically connecting a corresponding interconnection formed in the third interconnection layer 240 of a lower layer and a corresponding interconnection formed in an anode 243 to be described later of an upper layer to each other is formed in the fourth insulating layer 241.

The pixel circuit 210 is manufactured by forming the organic light emitting diode 211 on the fourth insulating layer 241 having the third via 242 formed therein. Although FIG. 6 shows only the anode 243 of the organic light emitting diode 211, the organic light emitting diode 211 is formed by sequentially stacking an organic layer and a cathode functioning as a light emission layer on the anode 243.

Here, in the present embodiment, a capacitance element (the holding capacitance 227 shown in FIG. 5) is formed in the second interconnection layer 237 and the third interconnection layer 240. Specifically, a lower electrode (a capacitance element lower electrode 251) of the capacitance element is formed in the second interconnection layer 237. An upper electrode (a capacitance element upper electrode 252) of the capacitance element is formed in the upper layer of the second interconnection layer 237 through an insulator having a thickness corresponding to the capacity of the capacitance element. The capacitance element upper electrode 252 is provided inside the third insulating layer 238. That is, although the description is omitted above, the third insulating layer 238 is actually stacked in two stages with the capacitance element upper electrode 252 as a boundary. After the second interconnection layer 237 is formed, an insulator having a thickness corresponding to the capacity of the capacitance element is stacked, and the capacitance element upper electrode 252 is formed on the insulator by the same method as the interconnection layer. Thereafter, the third insulating layer 238 is formed by further stacking an insulator having a prescribed thickness.

In the third insulating layer 238, a second via 239 is also provided at a position corresponding to the capacitance element upper electrode 252. In addition, the capacitance element upper electrode 252 is electrically connected to an electrode 254 formed in the third interconnection layer 240 through the second via 239. Since the electrode 254 is an electrode for extracting the potential of the capacitance element upper electrode 252 and is an electrode having the same potential as the capacitance element upper electrode 252, the electrode 254 will also be hereinafter referred to as the capacitance element upper electrode 254.

Here, interconnections (that is, the H scanning line 228, the V signal line 229, and the like) included in the pixel circuit 210 and a specific layout of a capacitance element (that is, the holding capacitance 227) will be examined. As described above, these interconnections are formed in the first interconnection layer 234, the second interconnection layer 237, and/or the third interconnection layer 240. In addition, the capacitance element lower electrode 251 and the capacitance element upper electrode 254 of the capacitance element are respectively formed in the second interconnection layer 237 and the third interconnection layer 240. In this manner, the interconnections and the capacitance element lower electrode 251 and the capacitance element upper electrode 254 of the capacitance element may be formed within the same interconnection layer.

Here, an attempt to reduce a pixel size for a reason such as an increase in definition of display in the display device 1 may result in various problems obstructing normal operation of the pixel circuit 220. Examples of such problems include deterioration of emission luminance uniformity caused by noise interference between electrodes due to an increase in parasitic capacitance between interconnections, deterioration of luminance uniformity caused by deterioration of noise resistance due to the pressure of the area of an electrode of a capacitance element, a failure of a short circuit between interconnections due to a pixel interconnection becoming dense, a failure of interconnection open due to film skipping of an interconnection pattern having a small area, and the like. Therefore, in a case in which a relatively small pixel size is particularly required, it is important to devise layouts of the first interconnection layer 234, the second interconnection layer 237, and the third interconnection layer 240 to prevent these problems from occurring to the utmost while keeping a pixel size small.

The inventors have, through ardent research, conceived preferred layouts of the first interconnection layer 234, the second interconnection layer 237, and the third interconnection layer 240 which are capable of avoiding the above-described problems. Hereinafter, these preferred layouts will be described in detail with reference to the accompanying drawings.

Figure 7:
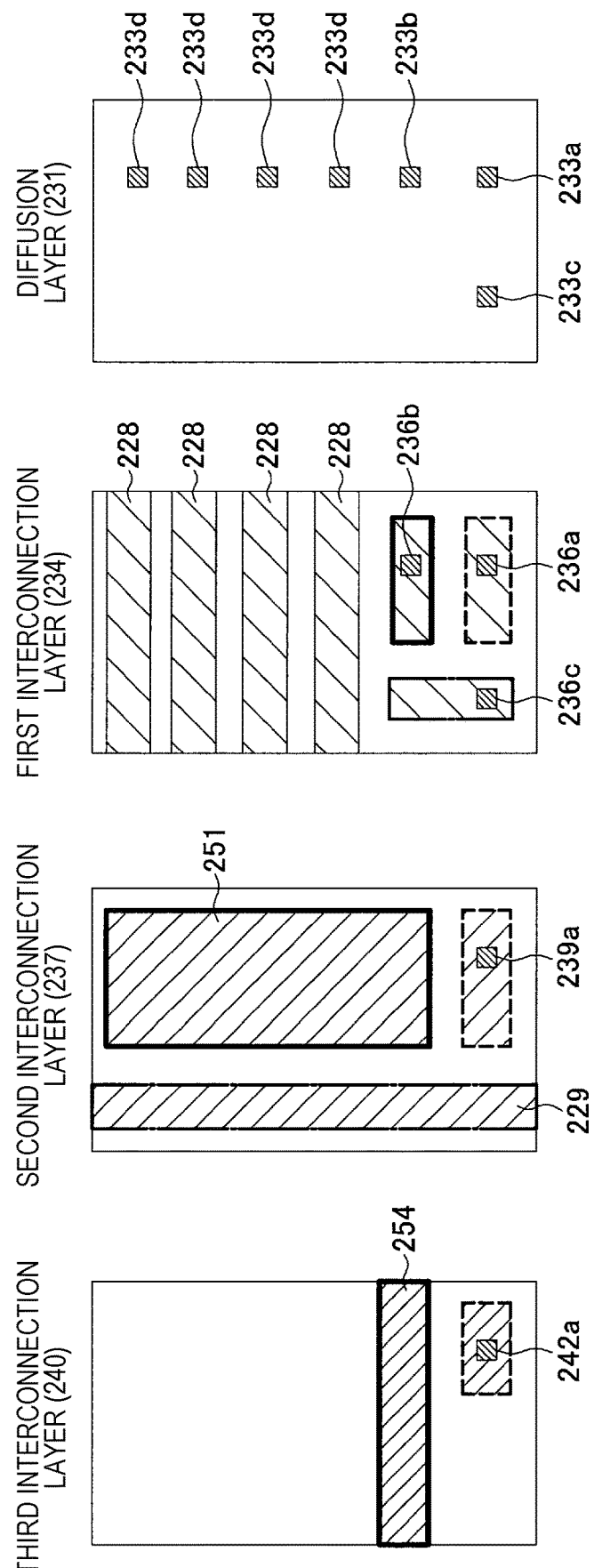
FIG. 7 is a diagram for describing an example of a layout of an interconnection layer according to the present embodiment.

FIG. 7 is a diagram for describing an example of a layout of an interconnection layer according to the present embodiment. In FIG. 7 and FIGS. 8 to 10 to be described later, layouts of the diffusion layer 231, the first interconnection layer 234, the second interconnection layer 237, and the third interconnection layer 240 are schematically shown.

Note that, in FIG. 7 and FIGS. 8 to 10 to be described later, a layout of an interconnection layer is described, and thus only a layout of the contact 233 is shown with respect to the diffusion layer 231. In addition, a connection state between interconnection layers is shown with respect to the first interconnection layer 234, the second interconnection layer 237, and the third interconnection layer 240, and thus layouts of the first via 236, the second via 239, and the third via 242 are also shown together with layouts of interconnections within the interconnection layers.

Further, in FIG. 7 and FIGS. 8 to 10 to be described later, a contact and a via with "a" at the end of a reference numeral represent a contact and a via which are ultimately connected to the anode 243 in the upper layer. Similarly, a contact and a via with "b" at the end of a reference numeral represent a contact and a via which are ultimately connected to the capacitance element lower electrode 251 in the upper layer. Similarly, a contact and a via with "c" at the end of a reference numeral represent a contact and a via which are ultimately connected to the V signal line 229 in the upper layer. Similarly, a contact and a via with "d" at the end of a reference numeral represent a contact and a via which are ultimately connected to the H scanning line 228 in the upper layer.

Further, in FIG. 7 and FIGS. 8 to 10 to be described later, for the sake of description, an interconnection related to the anode 243 (that is, an interconnection having the same potential as the anode 243) is indicated by a dashed line, an interconnection related to the capacitance element lower electrode 251 (that is, the capacitance element lower electrode 251 itself and an interconnection having the same potential as the capacitance element lower electrode 251) is indicated by a thick solid line, an interconnection related to the V signal line 229 (that is, the V signal line 229 itself and an interconnection having the same potential as the V signal line 229) is indicated by an alternating dotted-dashed line, and an interconnection related to the H scanning line 228 (that is, the H scanning line 228 itself and an interconnection having the same potential as the H scanning line 228) is indicated by a thin solid line with respect to the first interconnection layer 234, the second interconnection layer 237, and the third interconnection layer 240.

FIG. 7 shows an example of a layout in a case in which the H scanning line 228 and the V signal line 229 are formed in the first interconnection layer 234 and the second interconnection layer 237. As shown in FIG. 7, in the present embodiment, one of the H scanning line 228 and the V signal line 229, provided for one pixel circuit 220, which is larger in number is formed in a lower-level layer. In a case of a configuration example of the pixel circuit 220 shown in FIG. 5, the number of H scanning lines 228 provided for one pixel circuit 220 is larger than the number of V signal lines 229 as described above. Therefore, as shown in the drawing, in a case in which the H scanning line 228 and the V signal line 229 are formed in the first interconnection layer 234 and the second interconnection layer 237, the H scanning line 228 is formed in the first interconnection layer 234 and the V signal line 229 is formed in the second interconnection layer 237.

In this case, as shown in FIG. 7, in the first interconnection layer 234, an interconnection (an interconnection indicated by a dashed line in the drawing, and hereinafter, also referred to as a connection interconnection related to the anode 243) for connecting a corresponding electrode of the diffusion layer 231 to the anode 243 formed in the upper layer of the third interconnection layer 240, an interconnection (an interconnection indicated by a thick solid line in the drawing, and hereinafter, also referred to as a connection interconnection related to the capacitance element) for connecting a corresponding electrode of the diffusion layer 231 to the capacitance element lower electrode 251 formed in the second interconnection layer 237, and an interconnection (an interconnection indicated by an alternating dotted-dashed line in the drawing, and hereinafter, also referred to as a connection interconnection related to the V signal line 229) for connecting a corresponding electrode of the diffusion layer 231 to the V signal line 229 formed in the second interconnection layer 237 are formed together with the H scanning lines 228. Further, in the second interconnection layer 237, the capacitance element lower electrode 251 and a connection interconnection related to the anode 243 are formed together with the V signal line 229. Further, in the third interconnection layer 240, the capacitance element upper electrode 254 and a connection interconnection related to the anode 243 are formed. Note that the number of each of connection interconnections related to the anode 243, connection interconnections related to the capacitance element, and connection interconnections related to the V signal line 229, which are to be formed in each interconnection layer, is one.

Figure 8:
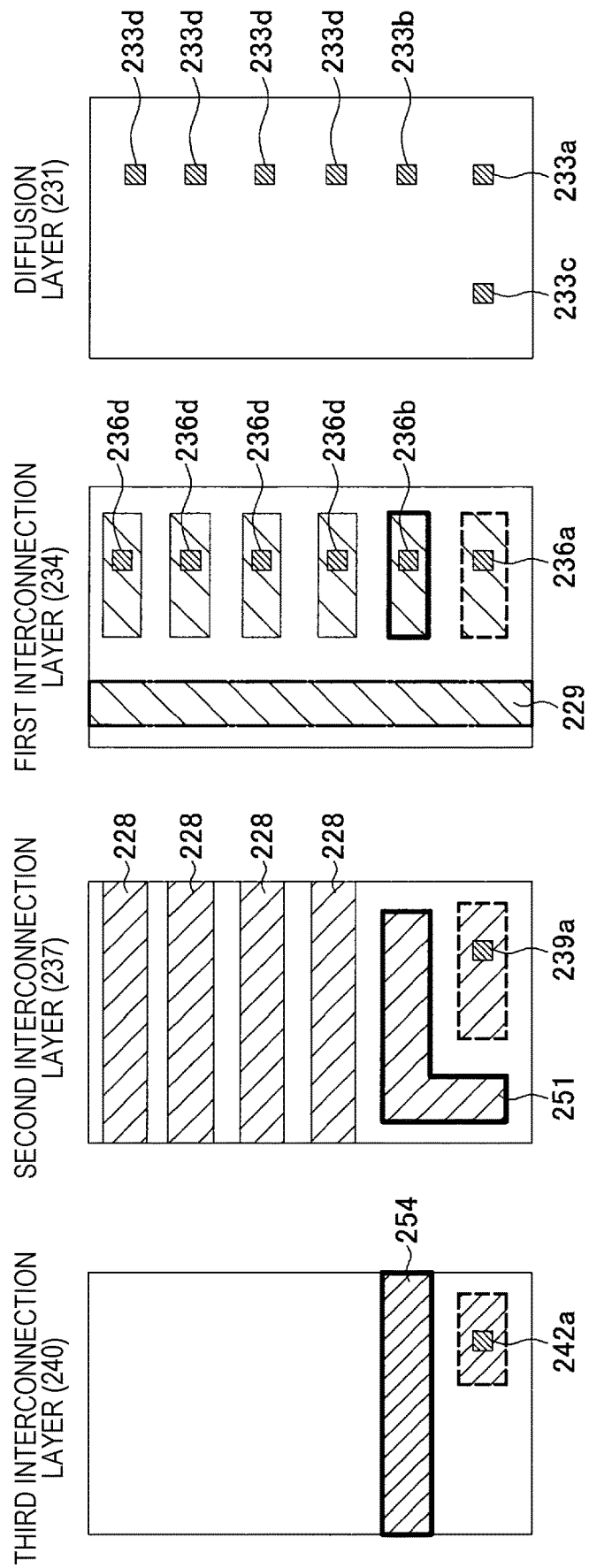
FIG. 8 is a diagram for comparison with the layout shown in FIG. 7, and is a diagram showing an example of a layout in a case in which an H scanning line and a V signal line are formed in an interconnection layer different from that in the present embodiment, in a case in which an H scanning line and a V signal line are formed in a first interconnection layer and a second interconnection layer.

Here, for comparison, FIG. 8 shows an example of a layout of an interconnection layer different from that in the present embodiment in a case in which the H scanning line 228 and the V signal line 229 are formed in the first interconnection layer 234 and the second interconnection layer 237. FIG. 8 is a diagram for comparison with the layout shown in FIG. 7, and is a diagram showing an example of a layout in a case in which the H scanning line 228 and the V signal line 229 are formed in an interconnection layer different from that in the present embodiment in a case in which the H scanning line 228 and the V signal line 229 are formed in the first interconnection layer 234 and the second interconnection layer 237. As shown in FIG. 8, contrary to the layout according to the present embodiment shown in FIG. 7, it is assumed that, one of the H scanning line 228 and the V signal line 229, provided for one pixel circuit 220, which is larger in number is formed in a higher-level layer. That is, it is assumed that the V signal line 229 is formed in the first interconnection layer 234, and the H scanning line 228 is formed in the second interconnection layer 237.

In this case, as shown in FIG. 8, in the first interconnection layer 234, a connection interconnection related to the anode 243, a connection interconnection related to the capacitance element, and an interconnection (an interconnection indicated by a thin solid in the drawing, and hereinafter, also referred to as a connection interconnection related to the H scanning line 228) for connecting a corresponding electrode of the diffusion layer 231 to the H scanning line 228 formed in the second interconnection layer 237 are formed together with the V signal line 229. The number of connection interconnections related to the H scanning line 228 corresponding to the number of H scanning lines 228 are formed. Further, in the second interconnection layer 237, the capacitance element lower electrode 251 and a connection interconnection related to the anode 243 are formed together with a larger number of H scanning lines 228. Further, in the third interconnection layer 240, the capacitance element upper electrode 254 and a connection interconnection related to the anode 243 are formed.

Comparing the layout according to the present embodiment shown in FIG. 7 and the layout shown in FIG. 8 with each other, the H scanning lines 228 which are a larger number of interconnections are formed in the first interconnection layer 234 which is a lower-level layer in the layout according to the present embodiment, and thus an interconnection pattern of the first interconnection layer 234 becomes relatively dense. On the other hand, in the layout shown in FIG. 8, the H scanning lines 228 which are a larger number of interconnections are not formed in the first interconnection layer 234, but it is necessary to form the number of connection interconnections related to the H scanning line 228 corresponding to the number of H scanning lines 228 in the first interconnection layer 234. Therefore, it can be said that the area of the connection interconnection related to the H scanning line 228 is smaller than that of the H scanning line 228, and consequently, the density of an interconnection pattern in the first interconnection layer 234 is not greatly lower than that of the layout according to the present embodiment.

On the other hand, in the layout according to the present embodiment, the V signal lines 229 which are a smaller number of interconnections are formed in the second interconnection layer 237, and thus an interconnection pattern of the second interconnection layer 237 becomes relatively sparse. On the other hand, in the layout shown in FIG. 8, the H scanning lines 228 which are a larger number of interconnections are formed in the second interconnection layer 237, and thus an interconnection pattern of the second interconnection layer 237 becomes relatively dense.

In this manner, according to the present embodiment, with respect to the H scanning line 228 and the V signal line 229, it is possible to make an interconnection pattern in the second interconnection layer 237 which is a higher-level layer more sparse by configuring layouts of the first interconnection layer 234 and the second interconnection layer 237 so as to form the H scanning lines 228 which are a larger number of interconnections provided for one pixel circuit 220 in the first interconnection layer 234 which is a lower-level layer.

The interconnection pattern in the second interconnection layer 237 becomes more sparse, and thus it is possible to suppress the occurrence of deterioration of luminance uniformity caused by an increase in parasitic capacitance between interconnections in the second interconnection layer 237, a failure of a short circuit between interconnections, and the like which are described above. Further, in the present embodiment, since the capacitance element lower electrode 251 is provided in the second interconnection layer 237, the interconnection pattern of the second interconnection layer 237 becomes sparse, and thus the degree of freedom of the layout of the capacitance element lower electrode 251 increases and it is possible to secure a sufficient area in which desired capacity can be realized with respect to the capacitance element lower electrode 251. Therefore, it is possible to suppress the occurrence of deterioration of luminance uniformity caused by the pressure of an area of an electrode of the capacitance element, a failure of interconnection open due to an interconnection pattern (electrode) having a small area not being provided, and the like. Accordingly, it is possible to suppress the occurrence of these various problems and to realize the display device 1 with higher reliability and higher definition.

Here, FIG. 7 shows an example of a layout in a case in which the H scanning line 228 and the V signal line 229 are respectively formed in the first interconnection layer 234 and the second interconnection layer 237, but the present embodiment is not limited to such an example. A layout method (that is, a method of forming one of the H scanning line 228 and the V signal line 229, provided for one pixel circuit 220, which is larger in number in a lower-level layer) can be applied even in a case in which the H scanning line 228 and the V signal line 229 are formed in other interconnection layers.

Figure 9:
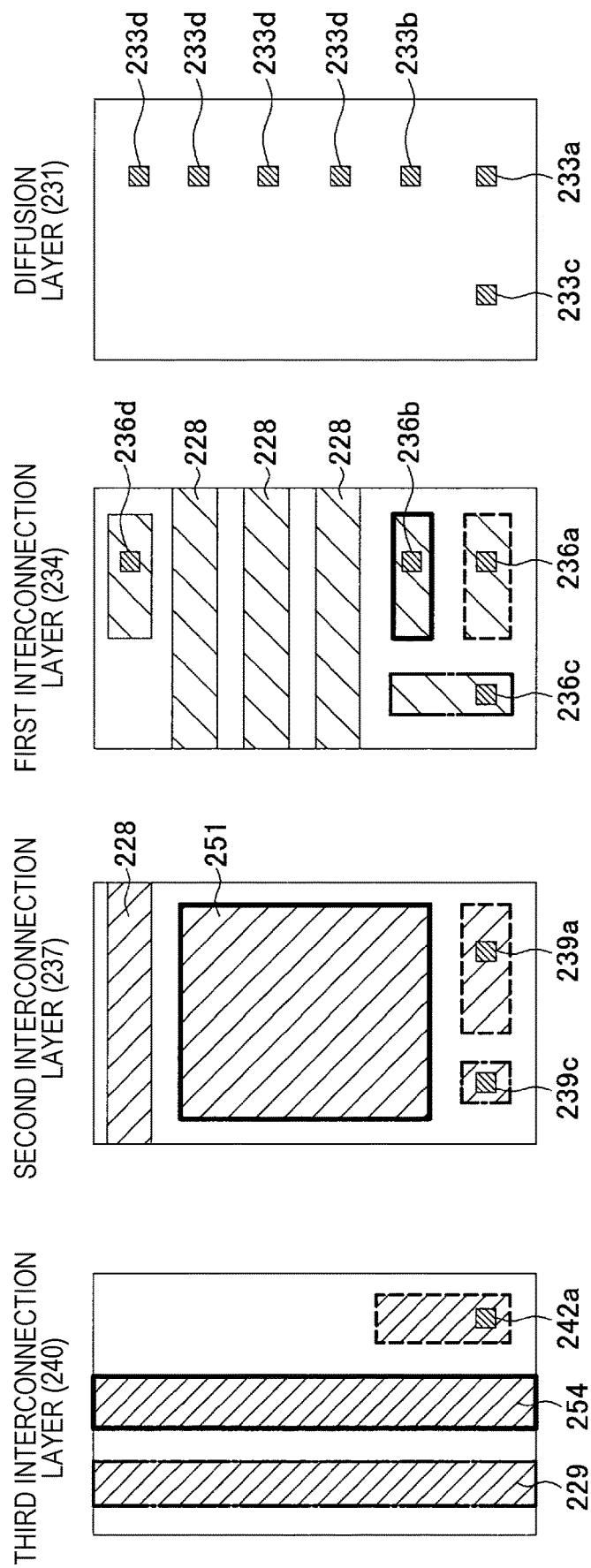
FIG. 9 is a diagram for describing another example of a layout of the interconnection layer according to the present embodiment.

Another example of a layout of an interconnection layer according to the present embodiment will be described with reference to FIG. 9. FIG. 9 is a diagram for describing another example of a layout of an interconnection layer according to the present embodiment.

FIG. 9 shows an example of a layout in a case in which the H scanning line 228 and the V signal line 229 are formed in the first interconnection layer 234, the second interconnection layer 237, and the third interconnection layer 240. As shown in FIG. 9, even in such a case, in the present embodiment, one of the H scanning line 228 and the V signal line 229, provided for one pixel circuit 220, which is larger in number than the other is formed in a lower-level layer. Therefore, for example, as shown in the drawing, the H scanning line 228 is formed in the first interconnection layer 234 and the second interconnection layer 237, and the V signal line 229 is formed in the third interconnection layer 240.

In this case, as shown in FIG. 9, for example, in the first interconnection layer 234, a connection interconnection related to the anode 243, a connection interconnection related to the capacitance element, and a connection interconnection related to the V signal line 229 are formed together with some (three H scanning lines in the example shown in the drawing) of the H scanning lines 228. Further, in the second interconnection layer 237, the capacitance element lower electrode 251, a connection interconnection related to the anode 243, and a connection interconnection related to the V signal line 229 are formed together with the remaining H scanning lines 228 (one H scanning line in the example shown in the drawing). Further, in the third interconnection layer 240, the capacitance element upper electrode 254 and a connection interconnection related to the anode 243 are formed together with the V signal line 229. In the example shown in FIG. 7, the plurality of H scanning lines 228 are formed in the same interconnection layer, but the plurality of H scanning lines 228 may be formed so as to be dispersed to different interconnection layers in this manner in the present embodiment.

Figure 10:
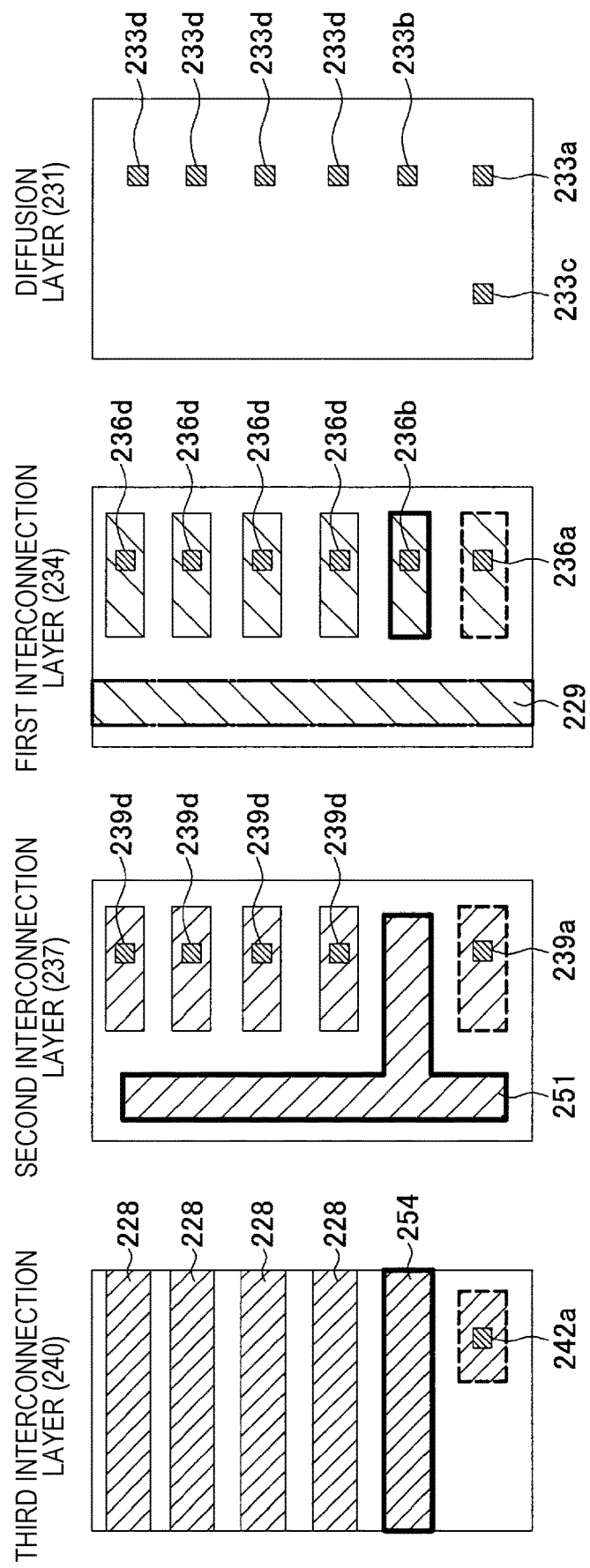
FIG. 10 is a diagram for comparison with the layout shown in FIG. 9, and is a diagram showing an example of a layout in a case in which an H scanning line and a V signal line are formed in an interconnection layer different from that in the present embodiment, in a case in which an H scanning line and a V signal line are formed in a first interconnection layer, a second interconnection layer, and a third interconnection layer.

Here, for comparison, FIG. 10 shows an example of a layout of an interconnection layer different from that in the present embodiment in a case in which the H scanning line 228 and the V signal line 229 are formed in the first interconnection layer 234, the second interconnection layer 237, and the third interconnection layer 240. FIG. 10 is a diagram for comparison with the layout shown in FIG. 9, and is a diagram showing an example of a layout in a case in which the H scanning line 228 and the V signal line 229 are formed in an interconnection layer different from that in the present embodiment in a case in which the H scanning line 228 and the V signal line 229 are formed in the first interconnection layer 234, the second interconnection layer 237, and the third interconnection layer 240. As shown in FIG. 10, contrary to the layout according to the present embodiment shown in FIG. 9, it is assumed that one of the H scanning line 228 and the V signal line 229, provided for one pixel circuit 220, which is larger in number is formed in a higher-level layer. Here, it is assumed that the V signal line 229 is formed in the first interconnection layer 234, and the H scanning line 228 is formed in the third interconnection layer 240.

In this case, as shown in FIG. 10, in the first interconnection layer 234, a connection interconnection related to the anode 243, a connection interconnection related to the capacitance element, and a connection interconnection related to the H scanning line 228 are formed together with the V signal line 229. Further, in the second interconnection layer 237, a connection interconnection related to the anode 243 and a connection interconnection related to the H scanning line 228 are formed together with the capacitance element lower electrode 251. Note that, in the first interconnection layer 234 and the second interconnection layer 237, the number of connection interconnections related to the H scanning line 228 corresponding to the number of H scanning lines 228 are formed. Further, in the third interconnection layer 240, the capacitance element upper electrode 254 and a connection interconnection related to the anode 243 are formed together with a larger number of H scanning lines 228.

Comparing the layout according to the present embodiment shown in FIG. 9 and the layout shown in FIG. 10 with each other, half of the H scanning lines 228 which are a larger number of interconnections are formed in the first interconnection layer 234 which is a lower-level layer in the layout according to the present embodiment, and thus an interconnection pattern of the first interconnection layer 234 becomes relatively dense. On the other hand, in the layout shown in FIG. 8, the H scanning lines 228 which are a larger number of interconnections are not formed in the first interconnection layer 234, but it is necessary to form the number of connection interconnections related to the H scanning line 228 corresponding to the number of H scanning lines 228 in the first interconnection layer 234. Therefore, it can be said that the area of the connection interconnection related to the H scanning line 228 is smaller than that of the H scanning line 228, and consequently, the density of an interconnection pattern in the first interconnection layer 234 is not greatly lower than that of the layout according to the present embodiment.

On the other hand, in the layout according to the present embodiment, the V signal lines 229 which are a smaller number of interconnections are formed in the third interconnection layer 240, and thus interconnection patterns of the second interconnection layer 237 and the third interconnection layer 240 become relatively sparse. On the other hand, in the layout shown in FIG. 8, since the H scanning lines 228 which are a larger number of interconnections are formed in the third interconnection layer 240, it is necessary to form the number of connection interconnections related to the H scanning line 228 corresponding to the number of H scanning lines 228 in the second interconnection layer 237, and thus an interconnection pattern of the second interconnection layer 237 becomes relatively dense.

In this manner, according to the layout shown in FIG. 9, with respect to the H scanning line 228 and the V signal line 229, it is possible to make interconnection patterns in the second interconnection layer 237 and the third interconnection layer 240 which are higher-level layers more sparse by configuring layouts of the first interconnection layer 234, the second interconnection layer 237, and the third interconnection layer 240 so as to form the H scanning lines 228 which are a larger number of interconnections provided for one pixel circuit 220 in the first interconnection layer 234 and the second interconnection layer 237 which are lower-level layers. Therefore, it is possible to the same effects as those in a case in which the above-described layout shown in FIG. 7 is applied, that is, to realize the display device 1 with high definition and higher reliability.

Further, according to the present embodiment, it is also possible to exhibit the following effects.

For example, in a case in which it is not possible to secure a sufficient area in which desired capacity can be realized in the second interconnection layer 237 with respect to the capacitance element lower electrode 251 by performing the layouts as shown in FIGS. 8 and 10, it may be necessary to increase the number of interconnection layers in order to create a capacitance element having desired capacity and to form capacitance elements in the increased interconnection layers. In this case, the number of masks and the number of steps are increased due to the increase in the number of interconnection layers, which may increase manufacturing costs. On the other hand, according to the layout of the present embodiment, since it is possible to secure a sufficient area of the capacitance element lower electrode 251 as described above, it is possible to form a capacitance element with desired capacity without causing such an increase in the number of interconnection layers. In this manner, according to the present embodiment, it is also possible to exhibit an effect of suppressing an increase in manufacturing costs.

Further, in the present embodiment, a larger number of interconnections are formed in an interconnection layer of a lower layer, and thus an interconnection pattern of the interconnection layer of a lower layer becomes dense to no small extent, as compared to a case in which a larger number of interconnections are formed in an interconnection layer of an upper layer and an isolated connection interconnection (the above-described connection interconnection related to the H scanning line 228, and the like) is formed in an interconnection layer of a lower layer. In this manner, an interconnection pattern in an interconnection layer of a lower layer closer to the diffusion layer 231 having transistors formed therein becomes dense, and thus it is possible to improve an effect of shielding the transistors from light. Therefore, it is possible to more suppress a fluctuation in characteristics of the transistors due to exposure to light and to further improve reliability of the display device 1.

In addition, an interconnection pattern in an interconnection layer of an upper layer, particularly, a highest-level interconnection layer can be made relatively sparse, and thus it is possible to improve flatness of the anode 243 of the organic light emitting diode 221 formed in the upper layer located at a higher position of the highest-level interconnection layer. Thereby, it is possible to improve light emission efficiency of the organic light emitting diode 221, and a further improvement in display quality can be realized.

In addition, an interconnection pattern of an interconnection layer of an upper layer can be made relatively sparse, and thus the degree of freedom of arrangement of a connection interconnection related to the anode 243 formed in the third interconnection layer 240 which is a highest-level interconnection layer (that is, arrangement of the third via 242 for connecting the connection interconnection related to the anode 243 and the anode 243 in the upper layer to each other) is improved. Thereby, the design of layouts of pixels is more facilitated.

Figure 11:
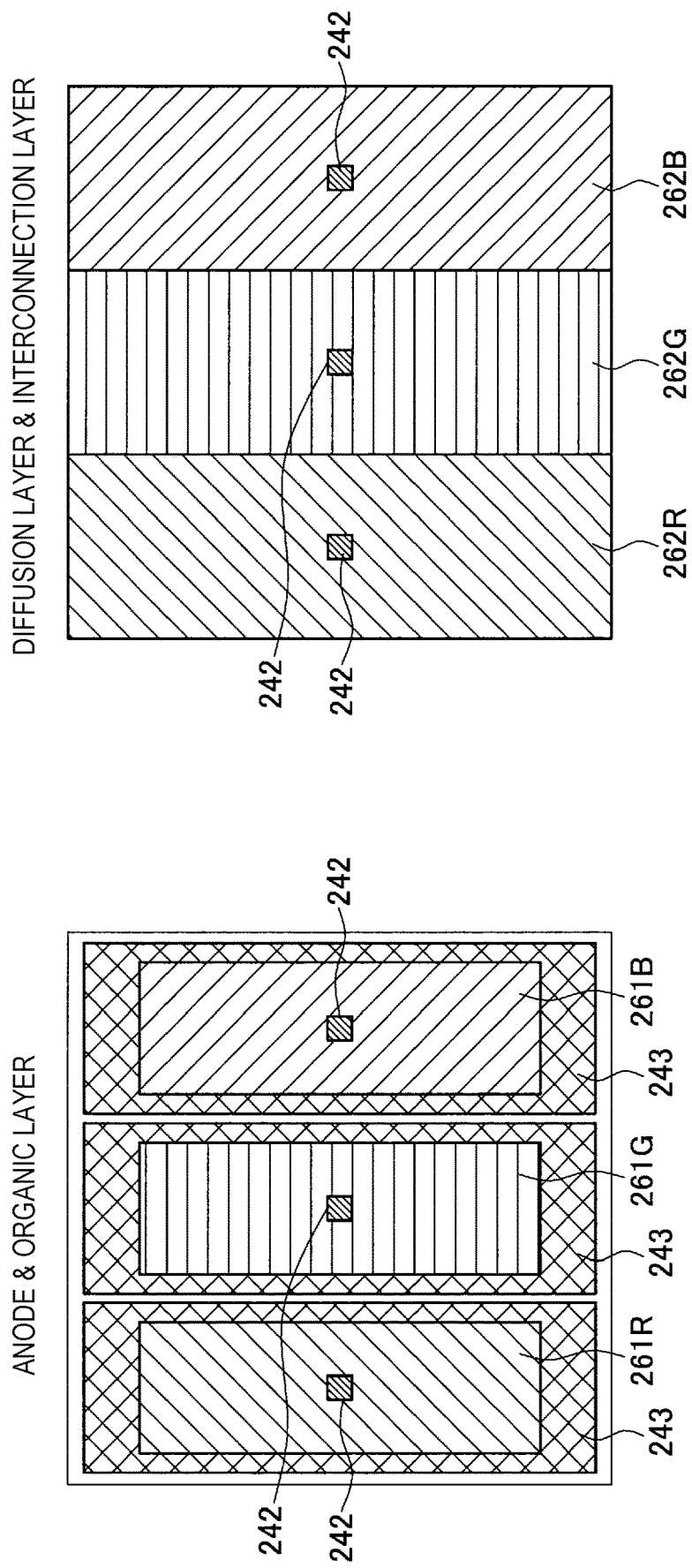
FIG. 11 is a diagram showing an example of arrangement of third vias in three sub-pixels in a case in which one pixel is formed in the three sub-pixels.
Figure 12:
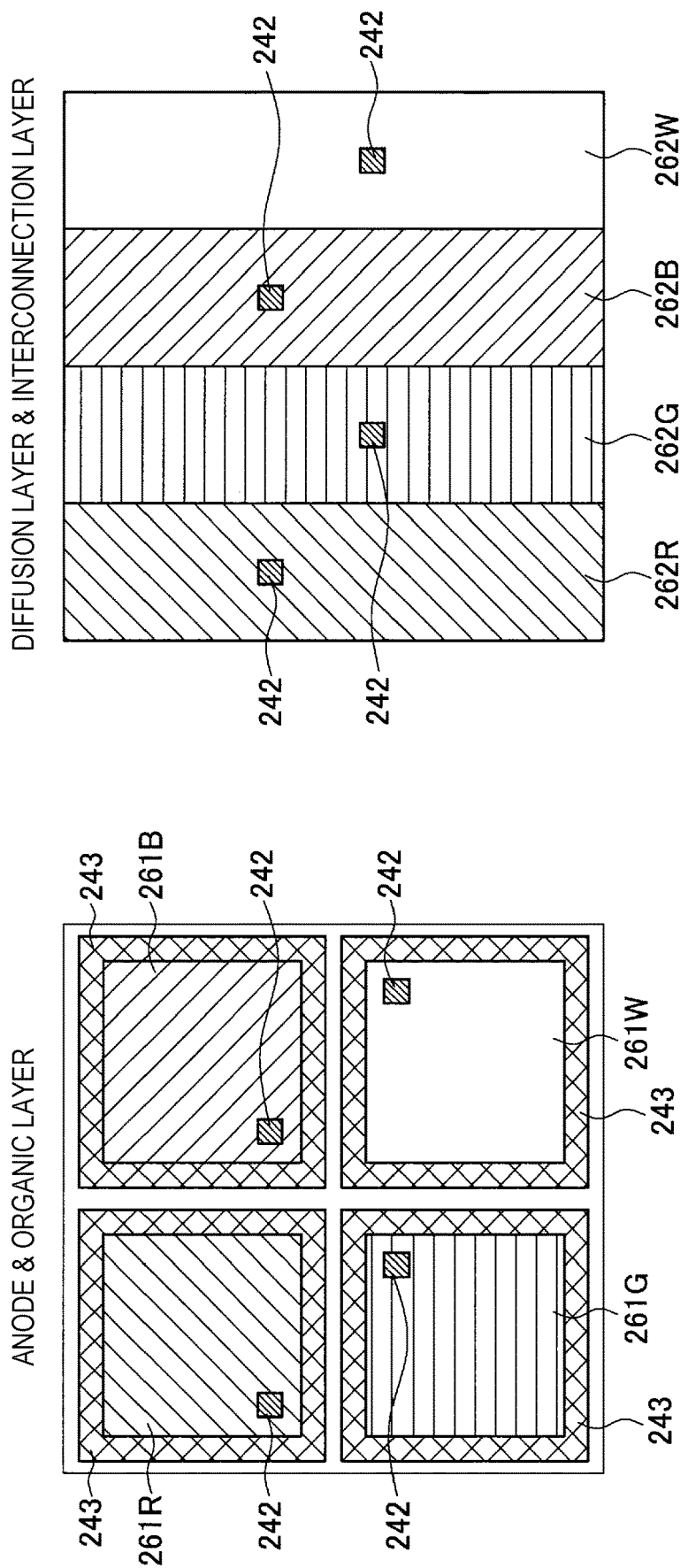
FIG. 12 is a diagram showing an example of arrangement of third vias in four sub-pixels in a case in which one pixel is formed in the four sub-pixels.

This point will be described in more detail with reference to FIGS. 11 and 12. FIG. 11 is a diagram showing an example of arrangement of the third vias 242 in three sub-pixels in a case in which one pixel is formed of these three sub-pixels. FIG. 12 is a diagram showing an example of arrangement of the third vias 242 in four sub-pixels in a case in which one pixel is formed of these four sub-pixels.

Both FIGS. 11 and 12 show a top view having a configuration in which the anode 243 and an organic layer 261 (a layer functioning as a light emission layer in the light emitting organic light emitting diode 221) corresponding to one pixel are stacked on the left side of the drawing, and simulatively shows arrangement of the third vias 242 for such a configuration. In addition, the right side of the drawing shows a top view of a configuration 262 in which the diffusion layer 231 and interconnection layers (the first interconnection layer 234, the second interconnection layer 237, and the third interconnection layer 240) are stacked, similarly corresponding to one pixel, and simulatively shows arrangement of the third vias 242 for such a configuration. Regarding the configuration 262 in which the diffusion layer 231 and the interconnection layers are stacked, detailed illustration of the inside of each layer is omitted for the sake of convenience. Note that, in FIGS. 11 and 12, regarding the organic layer 261 and the configuration 262 in which the diffusion layer 231 and the interconnection layers are stacked, a letter indicating the color of its corresponding sub-pixel (R: Red, G: Green, B: Blue, W: White) is attached to the end of a reference numeral. Actually, since the color of each sub-pixel is controlled by a color filter (CF) provided at a higher-level layer than the organic light emitting diode 221, there is no difference in structure due to color with regard to the organic layer 261 and the configuration 262 in which the diffusion layer 231 and the interconnection layer are stacked.

As shown in FIG. 11, in a case in which one pixel is formed of three sub-pixels, the arrangement of the third vias 242 is substantially the same in the sub-pixels. Therefore, there is not much advantage due to an improvement in the degree of freedom of arrangement of the third vias 242.

On the other hand, as shown in FIG. 12, in a case in which one pixel is formed of four sub-pixels, there is a difference in the arrangement of the third vias 242 between the sub-pixels. That is, it is also necessary to change arrangement of a connection interconnection related to the anode 243 in the third interconnection layer 240 for each sub-pixel. In this case, for example, as a result of the execution of the layout as shown in FIG. 10, when an interconnection pattern in the third interconnection layer 240 is dense, the degree of freedom of arrangement of the connection interconnection related to the anode 243 is low. Therefore, in order to make arrangement of the connection interconnection related to the anode 243 different for each sub-pixel, there is a concern that it is necessary to make the entire layout of the third interconnection layer 240 different for each sub-pixel. In this case, accordingly, it may also be necessary to make layouts of the second interconnection layer 237 and the first interconnection layer 234 of lower layers different for each sub-pixel, which results in an enormous amount of work for the layouts and a heavy burden on a designer.

On the other hand, according to the present embodiment, it is possible to make an interconnection pattern of an interconnection layer of an upper layer relatively sparse, and thus the degree of freedom of arrangement of a connection interconnection related to the anode 243 in the third interconnection layer 240 is high. Therefore, it is possible to configure a layout of the third interconnection layer 240 so that only the arrangement of the connection interconnection related to the anode 243 is different for each sub-pixel and arrangements of the other interconnections are the same for each sub-pixel. In this case, with regard to the layouts of the second interconnection layer 237 and the first interconnection layer 234 of lower layers, it is sufficient if only arrangement of a connection interconnection related to the anode 243 is made different for each sub-pixel, and thus the degree of difficulty in designing the layouts is lowered. In this manner, a layout method for an interconnection layer according to the present embodiment also has an effect of reducing the degree of difficulty in designing a layout of one pixel in a case in which arrangement of the third via 242 (that is, a via for connecting a highest-level interconnection layer and the anode 243 to each other) is different for each sub-pixel as in a case in which the pixel is formed of four sub-pixels.

A layout of an interconnection layer according to the present embodiment has been described above. Note that, although only two examples of layouts shown in FIGS. 7 and 9 have been taken above, it is possible to apply a layout method for an interconnection layer according to the present embodiment even in a case in which the number of interconnection layers is different from three layers illustrated in the above description (for example, a case in which the number of interconnection layers is four or more), a case in which arrangement positions of the H scanning line 228 and the V signal line 229 in the interconnection layers are different from each other, a case in which the number of H scanning lines 228 and the number of V signal lines 229 are different from each other (for example, a case in which both the numbers are plural), a case in which magnitude relations of the number of H scanning lines 228 and the number of V signal lines 229 provided for each of the pixel circuits 210 and 220 are inverse, and the like. The layout method for the interconnection layer according to the present embodiment can be applied to various display devices as long as the display devices are display devices driven by an active matrix method. The number of connection interconnections related to the H scanning line 228 or the number of connection interconnections related to the V signal lines 229 in a lower-level interconnection layer is reduced by applying the layout method for the interconnection layer according to the present embodiment regardless of the number of interconnection layers and the like, and consequently, it is possible to make an interconnection pattern of a higher-level interconnection layer relatively sparse. In addition, it is possible to sufficiently secure the area of an electrode of a capacitance element by providing the electrode of the capacitance element (the capacitance element lower electrode 251 and/or the capacitance element upper electrode 254 in the interconnection layer having a relatively sparse interconnection pattern. Therefore, similarly to the above-described embodiment, it is possible to obtain various effects such as an improvement in reliability.

5. Specific Configuration Example of Display Device

Figure 13:
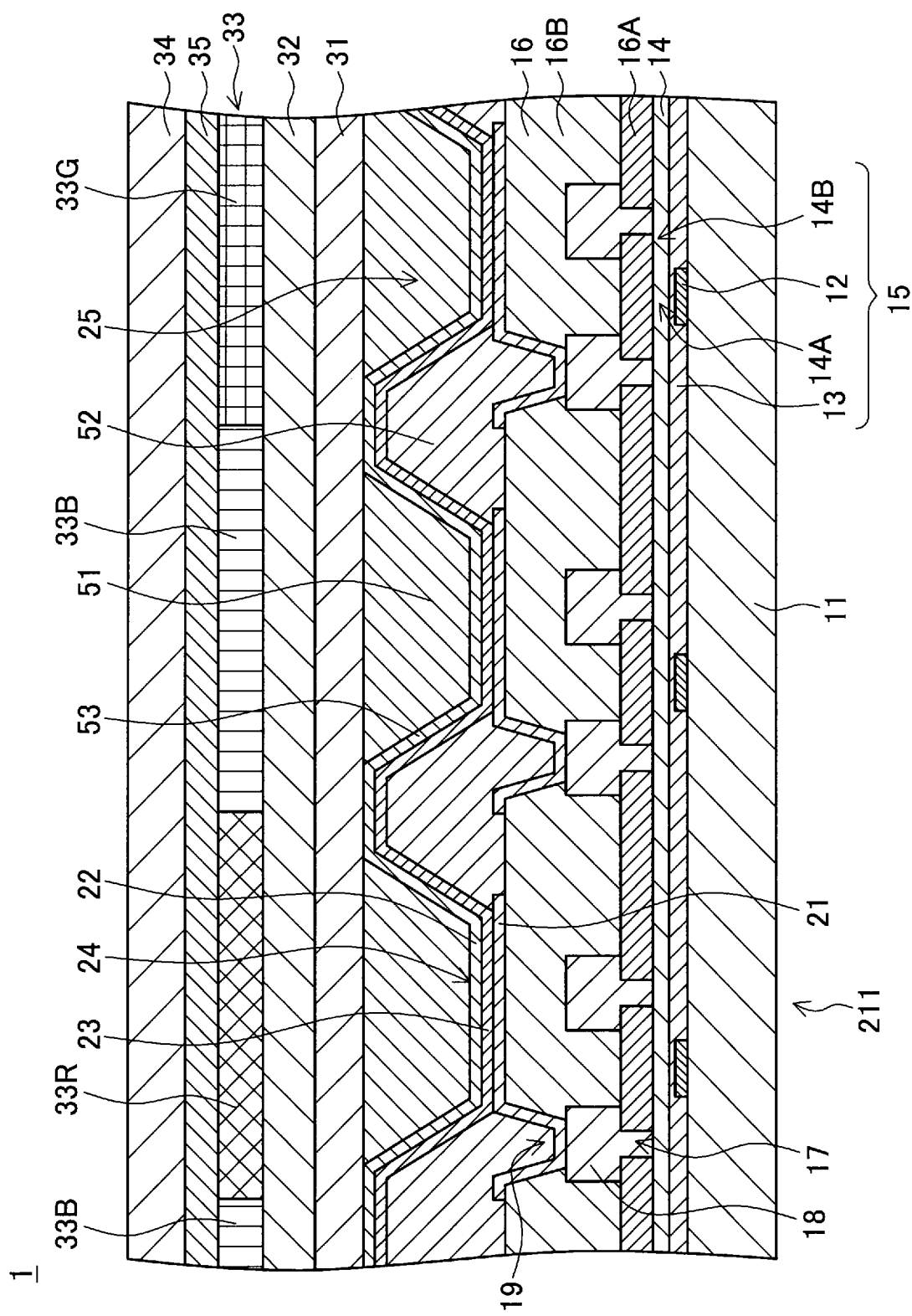
FIG. 13 is a cross-sectional view showing a specific configuration example of the display device according to the present embodiment.

A more specific configuration example of the display device 1 according to the present embodiment described hereinabove will now be described. FIG. 13 is a cross-sectional view showing a specific configuration example of the display device 1 according to the present embodiment. FIG. 13 shows a partial cross-sectional view of the display device 1.

Referring to FIG. 13, the display device 1 according to the present embodiment includes, on a first substrate 11, a plurality of organic light emitting diodes 211 each of which is a light emitting element that emits white light and a CF layer 33 that is provided on the organic light emitting diodes 211 and in which CFs of some colors are formed to correspond to the organic light emitting diodes 211. Further, a second substrate 34 that contains a material transparent to light from the organic light emitting diode 211 is placed on the CF layer 33. Further, on the first substrate 11, thin film transistors (TFTs) 15 for driving the organic light emitting diode 211 are provided to correspond to each of the organic light emitting diodes 211. The TFT 15 corresponds to each of the transistors included in the pixel circuit 210 described above (the driving transistor 212, the sampling transistor 213, the light emission control transistor 214, and the switching transistor 217). An arbitrary organic light emitting diode 211 is selectively driven by the TFTs 15; light from the driven organic light emitting diode 211 passes through the corresponding CF and the color of the light is converted as appropriate; and the light is emitted from the upper side via the second substrate 34; thereby, a desired image, a desired character, etc. are displayed.

Note that, in the following description, the stacking direction of the layers in the display device 1 is referred to also as an up and down direction. In this event, the side on which the first substrate 11 is placed is defined as a down side, and the side on which the second substrate 34 is placed is defined as an up side. Further, a plane perpendicular to the up and down direction is referred to also as a horizontal plane.

Thus, the display device 1 shown in FIG. 13 is a top emission display device capable of color display that is driven by an active matrix system. However, the present embodiment is not limited to this example, and the display device 1 according to the present embodiment may be a bottom emission display device that emits light via the first substrate 11.

First Substrate and Second Substrate

In the illustrated configuration example, the first substrate 11 includes a Si substrate. Further, the second substrate 34 contains quartz glass. However, the present embodiment is not limited to this example, and various known materials may be used as the first substrate 11 and the second substrate 34. For example, each of the first substrate 11 and the second substrate 34 may include a high strain point glass substrate, a soda-lime glass (a mixture of $Na_2O$, CaO, and $SiO_2$) substrate, a borosilicate glass (a mixture of $Na_2O$, $B_2O_3$, and $SiO_2$) substrate, a forsterite ($Mg_2SiO_4$) substrate, a lead glass (a mixture of $Na_2O$, PbO, and $SiO_2$) substrate, various glass substrates in which an insulating film is formed on a surface, a quartz substrate, a quartz substrate in which an insulating film is formed on a surface, a Si substrate in which an insulating film is formed on a surface, or an organic polymer substrate (for example, polymethyl methacrylate (PMMA), polyvinyl alcohol (PVA), polyvinylphenol (PVP), a polyether sulfone (PES), a polyimide, a polycarbonate, polyethylene terephthalate (PET), or the like). The materials contained in the first substrate 11 and the second substrate 34 may be the same, or may be different. However, since the display device 1 is of the top emission type as described above, the second substrate 34 preferably contains a material with a high transmittance that can transmit the light from the organic light emitting diode 211 favorably.

Light Emitting Element and Second Member

The organic light emitting diode 211 includes a first electrode 21, an organic layer 23 provided on the first electrode 21, and a second electrode 22 formed on the organic layer 23. More specifically, a second member 52 in which openings 25 are provided so as to expose at least parts of the first electrode 21 is stacked on the first electrode 21, and the organic layer 23 is provided on portions of the first electrode 21 that are exposed at the bottoms of the openings 25. That is, the organic light emitting diode 211 has a configuration in which the first electrode 21, the organic layer 23, and the second electrode 22 are stacked in this order in the opening 25 of the second member 52. This stacked structure functions as a luminescence section 24 of each pixel. That is, a portion of the organic light emitting diode 211 falling under the opening 25 of the second member 52 serves as a luminescence surface. Further, the second member 52 functions as a pixel defining film that is provided between pixels and partitions the area of the pixel.

The organic layer 23 includes a luminescence layer containing an organic luminescent material, and can emit white light. The specific configuration of the organic layer 23 is not limited, and may be various publicly known configurations. For example, the organic layer 23 may have a stacked structure of a hole transport layer, a luminescence layer, and an electronic transport layer, a stacked structure of a hole transport layer and a luminescence layer that serves also as an electronic transport layer, a stacked structure of a hole injection layer, a hole transport layer, a luminescence layer, an electronic transport layer, and an electron injection layer, or the like. Further, in a case where each of these stacked structures or the like is used as a "tandem unit," the organic layer 23 may have a tandem structure of two stages in which a first tandem unit, a connection layer, and a second tandem unit are stacked. Alternatively, the organic layer 23 may have a tandem structure of three or more stages in which three or more tandem units are stacked. In a case where the organic layer 23 includes a plurality of tandem units, an organic layer 23 that emits white light as a whole can be obtained by assigning red, green, and blue to the luminescent colors of the luminescence layers of the tandem units.

In the illustrated configuration example, the organic layer 23 is formed by depositing an organic material by vacuum vapor deposition. However, the present embodiment is not limited to this example, and the organic layer 23 may be formed by various publicly known methods. For example, as the method for forming the organic layer 23, physical vapor deposition methods (PVD methods) such as the vacuum vapor deposition method, printing methods such as the screen printing method and the inkjet printing method, a laser transfer method in which a stacked structure of a laser absorbing layer and an organic layer formed on a substrate for transfer is irradiated with laser light to separate the organic layer on the laser absorbing layer and the organic layer is transferred, various application methods, etc. may be used.

The first electrode 21 functions as an anode. That is, the first electrode 21 corresponds to the anode 243 shown in FIG. 6 above. Since the display device 1 is of the top emission type as described above, the first electrode 21 contains a material capable of reflecting the light from the organic layer 23. In the illustrated configuration example, the first electrode 21 contains an alloy of aluminum and neodymium (Al—Nd alloy). Further, the film thickness of the first electrode 21 is approximately 0.1 µm to 1 µm, for example. However, the present embodiment is not limited to this example, and the first electrode 21 may contain various publicly known materials used as the material of an electrode on the light reflection side that functions as an anode in a common organic EL display device. Further, the film thickness of the first electrode 21 is not limited to the above example either, and the first electrode 21 may be formed in film thickness ranges commonly employed in organic EL display devices, as appropriate.

For example, the first electrode 21 may contain a metal with a high work function, such as platinum (Pt), gold (Au), silver (Ag), chromium (Cr), tungsten (W), nickel (Ni), copper (Cu), iron (Fe), cobalt (Co), or tantalum (Ta), or an alloy with a high work function (for example, a Ag—Pd—Cu alloy containing silver as a main component and containing 0.3 mass % to 1 mass % of palladium (Pd) and 0.3 mass % to 1 mass % of copper, an Al—Nd alloy, or the like). Alternatively, the first electrode 21 may contain an electrically conductive material having a small work function value and a high light reflectance, such as aluminum or an alloy containing aluminum. In this case, it is preferable to improve hole injection properties by providing an appropriate hole injection layer on the first electrode 21, or the like. Alternatively, the first electrode 21 may have a structure in which a transparent electrically conductive material excellent in hole injection characteristics, such as an oxide of indium and tin (ITO) or an oxide of indium and zinc (IZO), is stacked on a reflective film with high light reflectivity such as a dielectric multiple-layer film or aluminum.

The second electrode 22 functions as a cathode. Since the display device 1 is of the top emission type as described above, the second electrode 22 contains a material capable of transmitting the light from the organic layer 23. In the illustrated configuration example, the second electrode 22 contains an alloy of magnesium and silver (Mg—Ag alloy). Further, the film thickness of the second electrode 22 is approximately 10 nm, for example. However, the present embodiment is not limited to this example, and the second electrode 22 may contain various publicly known materials used as the material of an electrode on the light transmission side that functions as a cathode in a common organic EL display device. Further, the film thickness of the second electrode 22 is not limited to the above example either, and the second electrode 22 may be formed in film thickness ranges commonly employed in organic EL display devices, as appropriate.

For example, the second electrode 22 may contain aluminum, silver, magnesium, calcium (Ca), sodium (Na), strontium (Sr), an alloy of an alkali metal and silver, an alloy of an alkaline earth metal and silver (for example, an alloy of magnesium and silver (Mg—Ag alloy)), an alloy of magnesium and calcium (Mg—Ca alloy), an alloy of aluminum and lithium (Al—Li alloy), or the like. In a case where each of these materials is used in a single layer, the film thickness of the second electrode 22 is approximately 4 nm to 50 nm, for example. Alternatively, the second electrode 22 may have a structure in which a layer of any of the materials described above and a transparent electrode containing, for example, ITO or IZO (with a thickness of, for example, approximately 30 nm to 1 µm) are stacked from the organic layer 23 side. In a case where such a stacked structure is used, the thickness of the layer of any of the materials described above may be as thin as approximately 1 nm to 4 nm, for example. Alternatively, the second electrode 22 may include only a transparent electrode. Alternatively, the second electrode 22 may be provided with a bus electrode (auxiliary electrode) containing a low resistance material, such as aluminum, an aluminum alloy, silver, a silver alloy, copper, a copper alloy, gold, or a gold alloy, to reduce the resistance of the second electrode 22 as a whole.

In the illustrated configuration example, each of the first electrode 21 and the second electrode 22 is formed by forming a material as a film with a prescribed thickness by the vacuum vapor deposition method and then patterning the film by the etching method. However, the present embodiment is not limited to this example, and the first electrode 21 and the second electrode 22 may be formed by various publicly known methods. Examples of the method for forming the first electrode 21 and the second electrode 22 include vapor deposition methods including the electron beam vapor deposition method, the hot filament vapor deposition method, and the vacuum vapor deposition method, the sputtering method, the chemical vapor deposition method (CVD method), the metal organic chemical vapor deposition method (MOCVD method), a combination of the ion plating method and the etching method, various printing methods (for example, the screen printing method, the inkjet printing method, the metal mask printing method, etc.), plating methods (the electroplating method, the electroless plating method, etc.), the lift-off method, the laser ablation method, the sol-gel method, etc.

The second member 52 is formed by forming SiO$_2$ as a film with a prescribed film thickness by the CVD method and then patterning the SiO$_2$ film using photolithography technology and etching technology. However, the material of the second member 52 is not limited to this example, and various materials having insulating properties may be used as the material of the second member 52. Examples of the material contained in the second member 52 include SiO$_2$, MgF, LiF, a polyimide resin, an acrylic resin, a fluorine resin, a silicone resin, a fluorine-based polymer, a silicone-based polymer, etc. However, as described later, the second member 52 contains a material having a lower refractive index than the material of a first member 51.

Configuration of Parts Below Light Emitting Element

On the first substrate 11, the first electrode 21 included in the organic light emitting diode 211 is provided on an interlayer insulating layer 16 containing SiON. Then, the interlayer insulating layer 16 covers a light emitting element driving section formed on the first substrate 11.

The light emitting element driving section includes a plurality of TFTs 15. In other words, the light emitting element driving section corresponds to a driving circuit of the pixel circuit 210. The TFT 15 includes a gate electrode 12 formed on the first substrate 11, a gate insulating film 13 formed on the first substrate 11 and the gate electrode 12, and a semiconductor layer 14 formed on the gate insulating film 13. A region of the semiconductor layer 14 located immediately above the gate electrode 12 functions as a channel region 14A, and regions located so as to sandwich the channel region 14A function as source/drain regions 14B. Note that, although in the illustrated example the TFT 15 is of a bottom gate type, the present embodiment is not limited to this example, and the TFT 15 may be of a top gate type.

An interlayer insulating layer 16 including two layers (a lower layer interlayer insulating layer 16A and an upper layer interlayer insulating layer 16B) is stacked on the semiconductor layer 14 by the CVD method. In this event, after the lower layer interlayer insulating layer 16A is stacked, contact holes 17 are provided in portions of the lower layer interlayer insulating layer 16A corresponding to the source/drain regions 14B so as to expose the source/drain regions 14B, by using photolithography technology and etching technology, for example, and an interconnection 18 containing aluminum is formed so as to fill the contact hole 17. The interconnections 18 are formed by combining the vacuum vapor deposition method and the etching method, for example. After that, the upper layer interlayer insulating layer 16B is stacked.

In a portion of the upper layer interlayer insulating layer 16B where the interconnection 18 is provided, a contact hole 19 is provided so as to expose the interconnection 18, by using photolithography technology and etching technology, for example. Then, when forming the first electrode 21 of the organic light emitting diode 211, the first electrode 21 is formed so as to be in contact with the interconnection 18 via the contact hole 19. Thus, the first electrode 21 of the organic light emitting diode 211 is electrically connected to a source/drain region 14B of a TFT 15 (in the example of the pixel circuit shown in FIG. 3, corresponding to the drain region of the driving transistor 212) via the interconnection 18.

Note that, although in the above example the interlayer insulating layer 16 contains SiON, the present embodiment is not limited to this example. The interlayer insulating layer 16 may contain various publicly known materials that can be used as an interlayer insulating layer in a common organic EL display device. For example, as the material contained in the interlayer insulating layer 16, $SiO_2$-based materials (for example, $SiO_2$, BPSG, PSG, BSG, AsSG, PbSG, SiON, spin-on glass (SOG), low melting point glass, a glass paste, and the like), SiN-based materials, and insulating resins (for example, a polyimide resin, a novolac-based resin, an acrylic-based resin, polybenzoxazole, and the like) may be used singly or in combination, as appropriate. Further, the method for forming the interlayer insulating layer 16 is not limited to the above example either, and publicly known methods such as the CVD method, the application method, the sputtering method, and various printing methods may be used for the formation of the interlayer insulating layer 16. Furthermore, although in the above example the interconnection 18 is formed by forming aluminum as a film and patterning the film by the vacuum vapor deposition method and the etching method, the present embodiment is not limited to this example. The interconnection 18 may be formed by forming, as a film, any of various materials that are used as an interconnection in a common organic EL display device and patterning the film by various methods.

Further, FIG. 13 shows only one interconnection layer for the sake of convenience. Actually, as described above with reference to FIG. 6, a plurality of interconnection layers may be formed on a diffusion layer having the TFT 15 formed therein, and the organic light emitting diode 211 may further be formed on the plurality of interconnection layers.

Configuration of Parts Above Light Emitting Element

The opening 25 provided in the second member 52 of the organic light emitting diode 211 is formed so as to have a tapered shape in which the side wall of the opening 25 is inclined such that the opening area increases with proximity to the bottom. Then, a first member 51 is put in the opening 25. That is, the first member 51 is a layer that is provided immediately above the luminescence surface of the organic light emitting diode 211 and that propagates emission light from the light emitting element upward. Further, by forming the opening 25 of the second member 52 in the above manner, a cross-sectional shape in the stacking direction of the first member 51 (that is, the illustrated cross-sectional shape) has a substantially trapezoidal shape, and thus the first member 51 has a truncated conical or pyramidal shape in which the bottom surface faces up.

The first member 51 is formed by forming as a film by the vacuum vapor deposition method so as to fill the opening 25, and then planarizing the surface of the $Si_{1-x}N_x$ film by the chemical mechanical polishing method (CMP method) or the like. However, the material of the first member 51 is not limited to this example, and various materials having insulating properties may be used as the material of the first member 51. Examples of the material contained in the first member 51 include $Si_{1-x}N_x$, ITO, IZO, $TiO_2$, $Nb_2O_5$, a bromine-containing polymer, a sulfur-containing polymer, a titanium-containing polymer, a zirconium-containing polymer, etc. The method for forming the first member 51 is not limited to this example either, and various publicly known methods may be used as the method for forming the first member 51.

However, in the present embodiment, the materials of the first member 51 and the second member 52 are selected such that the refractive index $n_1$ of the first member 51 and the refractive index $n_2$ of the second member 52 satisfy the relation of $n_1 > n_2$. By selecting the materials of the first member 51 and the second member 52 such that the refractive indices satisfy the relation mentioned above, at least a part of the light that has propagated through the first member 51 is reflected at a surface of the second member 52 facing the first member 51. More specifically, the organic layer 23 and the second electrode 22 of the organic light emitting diode 211 are formed between the first member 51 and the second member 52, and therefore at least a part of the light that has propagated through the first member 51 is reflected at the interface between the second member 52 and the organic layer 23. That is, the surface of the second member 52 facing the first member 51 functions as a light reflection section (reflector) 53.

In the present embodiment, the first member 51 is provided immediately above the luminescence surface of the organic light emitting diode 211, as mentioned above. Then, the first member 51 has a truncated conical or pyramidal shape in which the bottom surface faces up, and therefore light emitted from the luminescence surface of the organic light emitting diode 211 is reflected upward, which is the light emission direction, by the interface between the first member 51 and the second member 52, that is, the reflector 53. Thus, according to the present embodiment, the efficiency of extracting emission light from the organic light emitting diode 211 can be improved by providing the reflector 53, and the luminance as the entire display device 1 can be improved.

Note that an investigation by the present inventors shows that, to improve the efficiency of extracting emission light from the organic light emitting diode 211 more favorably, it is preferable that the refractive indices of the first member 51 and the second member 52 satisfy the relation of $n_1-n_2 \geq 0.20$. It is more preferable that the refractive indices of the first member 51 and the second member 52 satisfy the relation of $n_1-n_2 \geq 0.30$. Furthermore, to further improve the efficiency of extracting emission light from the organic light emitting diode 211, it is preferable that the shape of the first member 51 satisfy the relations of $0.5 \leq R_1/R_2 \leq 0.8$ and $0.5 \leq H/R_1 \leq 0.8$. Here, $R_1$ represents the diameter of the light incidence surface of the first member 51 (that is, a surface facing down in the stacking direction and facing the luminescence surface of the organic light emitting diode 211), $R_2$ represents the diameter of the light emitting surface of the first member 51 (that is, a surface facing up in the stacking direction), and H represents the distance between the bottom surface and the upper surface (the height in the stacking direction) in a case where the first member 51 is regarded as a truncated cone or pyramid.

A protection film 31 and a planarizing film 32 are stacked in this order on the planarized first member 51. The protection film 31 is formed by, for example, stacking $Si_{1-y}N_y$ with a prescribed film thickness (approximately 3.0 μm) by the vacuum vapor deposition method. Further, the planarizing film 32 is formed by, for example, stacking $SiO_2$ with a prescribed film thickness (approximately 2.0 μm) by the CVD method and planarizing the surface by the CMP method or the like.

However, the materials and the film thicknesses of the protection film 31 and the planarizing film 32 are not limited to these examples, and the protection film 31 and the planarizing film 32 may contain various publicly known materials used as a protection film and a planarizing film of a common organic EL display device so as to have film thicknesses commonly employed in an organic EL display device, as appropriate.

However, in the present embodiment, it is preferable that the material of the protection film 31 be selected such that the refractive index $n_3$ of the protection film 31 is equal to the refractive index $n_1$ of the first member 51 or smaller than the refractive index $n_1$ of the first member 51. Furthermore, the materials of the protection film 31 and the planarizing film 32 are selected such that the absolute value of the difference between the refractive index $n_3$ of the protection film 31 and the refractive index $n_4$ of the planarizing film 32 is preferably less than or equal to 0.30 and more preferably less than or equal to 0.20. By thus selecting the materials of the protection film 31 and the planarizing film 32, the reflection or scattering of emission light from the organic light emitting diode 211 at the interface between the first member 51 and the protection film 31 and the interface between the protection film 31 and the planarizing film 32 can be suppressed, and light extraction efficiency can be further improved.

The CF layer 33 is formed on the planarizing film 32. Thus, the display device 1 is a display device of what is called an on-chip color filter (OCCF) system in which the CF layer 33 is formed on the first substrate 11 on which the organic light emitting diode 211 is formed. The second substrate 34 is stuck to the upper side of the CF layer 33 via, for example, a sealing resin film 35 of an epoxy resin or the like, and thereby the display device 1 is fabricated. Note that the material of the sealing resin film 35 is not limited to this example, and the material of the sealing resin film 35 may be selected in view of high transmissivity to the emission light from the organic light emitting diode 211, excellence in adhesiveness to the CF layer 33 located on the lower side and the second substrate 34 located on the upper side, low reflectivity of light at the interface with the CF layer 33 located on the lower side and the interface with the second substrate 34 located on the upper side, etc., as appropriate. However, the present embodiment is not limited to this example. The display device 1 may be a display device of what is called a facing CF system that is fabricated by the CF layer 33 being formed on the second substrate 34, and the first substrate 11 and the second substrate 34 being stuck together such that the CF layer 33 faces the organic light emitting diode 211.

The CF layer 33 is formed such that a CF of each color having a prescribed area is provided for each of the organic light emitting diode 211. The CF layer 33 may be formed by performing exposure on a resist material into a prescribed configuration and performing development by photolithography technology, for example. Further, the film thickness of the CF layer 33 is approximately 2 μm, for example. However, the material, the formation method, and the film thickness of the CF layer 33 are not limited to these examples, and the CF layer 33 may be formed so as to have a film thickness commonly employed in an organic EL display device by using various publicly known materials that are used as a CF layer of a common organic EL display device and various publicly known methods, as appropriate.

In the illustrated example, the CF layer 33 is provided such that a red CF 33R, a green CF 33G, and a blue CF 33B each having a prescribed area are continuously distributed in the horizontal plane. Note that, in the following description, in a case where there is no need to particularly distinguish the CF 33R, the CF 33G, and the CF 33B, one or a plurality of these may be written as simply a CF 33a. One sub-pixel includes a combination of one organic light emitting diode 211 and one CF 33a.

Hereinabove, a specific configuration example of the display device 1 is described. Note that, in regard to the configuration of the display device 1 described hereinabove, particularly the configuration of the reflector 53, JP 2013-191533A, which is a prior application by the present applicant, may be referred to, for example. However, the configuration of the display device 1 according to the present embodiment is not limited to this example. As described above, it is sufficient that the respects described in (4. Layout of interconnection layer) above be reflected in the display device 1 according to the present embodiment, and various known configurations used in ordinary display devices may be used for the other respects.

6. Application Examples

Application examples of the display device 1 according to the present embodiment described hereinabove will now be described. Herein, some examples of electronic apparatuses in which the display device 1 according to the present embodiment described hereinabove can be used are described.

Figure 14:
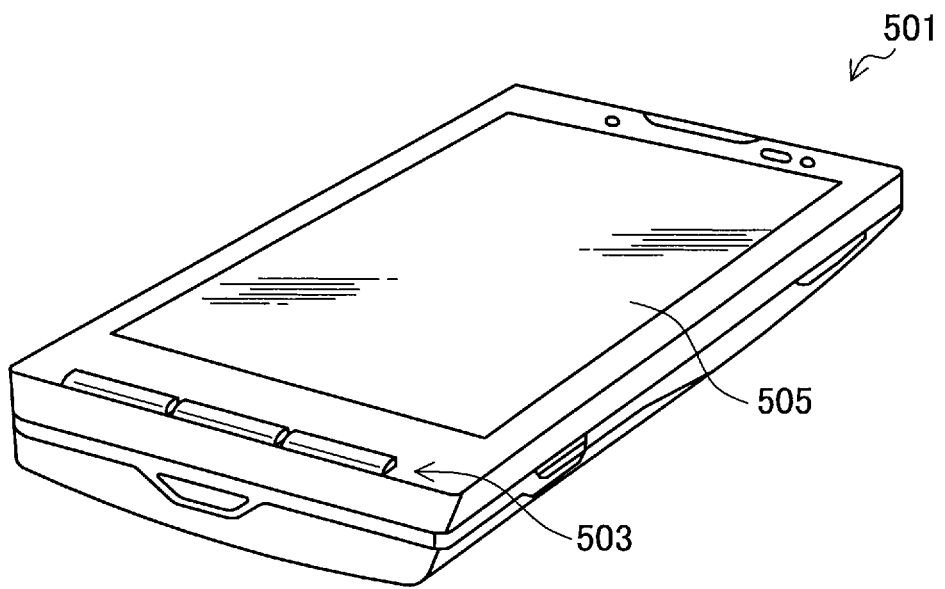
FIG. 14 is a diagram showing an external appearance of a smartphone that is an example of an electronic apparatus in which the display device according to the present embodiment can be used.

FIG. 14 is a diagram showing an external appearance of a smartphone that is an example of the electronic apparatus in which the display device 1 according to the present embodiment can be used. As shown in FIG. 14, a smartphone 501 includes an operation section 503 that includes a button and accepts an operation input by the user and a display section 505 that displays various pieces of information. The display device 1 may be applied to the display section 505.

Figure 15:
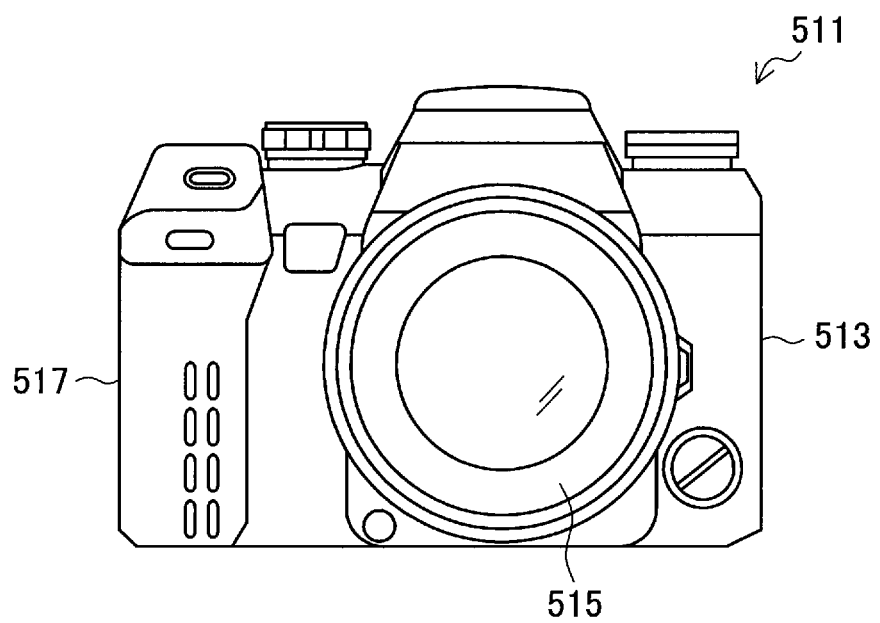
FIG. 15 is a diagram showing an external appearance of a digital camera that is another example of an electronic apparatus in which the display device according to the present embodiment can be used.
Figure 16:
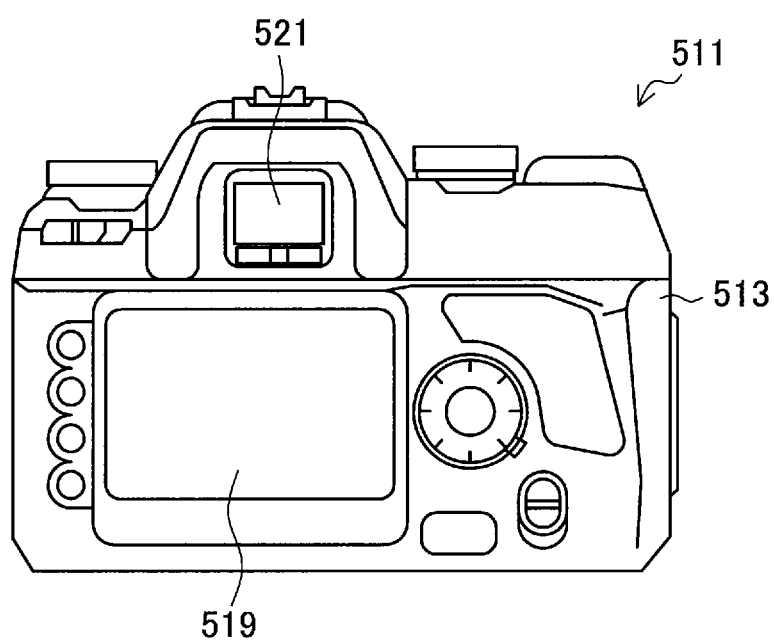
FIG. 16 is a diagram showing an external appearance of a digital camera that is another example of an electronic apparatus in which the display device according to the present embodiment can be used.

FIGS. 15 and 16 are diagrams showing external appearances of a digital camera that is another example of the electronic apparatus in which the display device 1 according to the present embodiment can be used. FIG. 15 shows an external appearance of a digital camera 511 as seen from the front side (the subject side), and FIG. 16 shows an external appearance of the digital camera 511 as seen from the rear side. As shown in FIGS. 15 and 16, the digital camera 511 includes a main body section (camera body) 513, a replaceable lens unit 515, a grip section 517 that is gripped by the user during photographing, a monitor 519 that displays various pieces of information, and an electronic view finder (EVF) 521 that displays a through image that is observed by the user during photographing. The display device 1 may be applied to the monitor 519 and the EVF 521.

Figure 17:
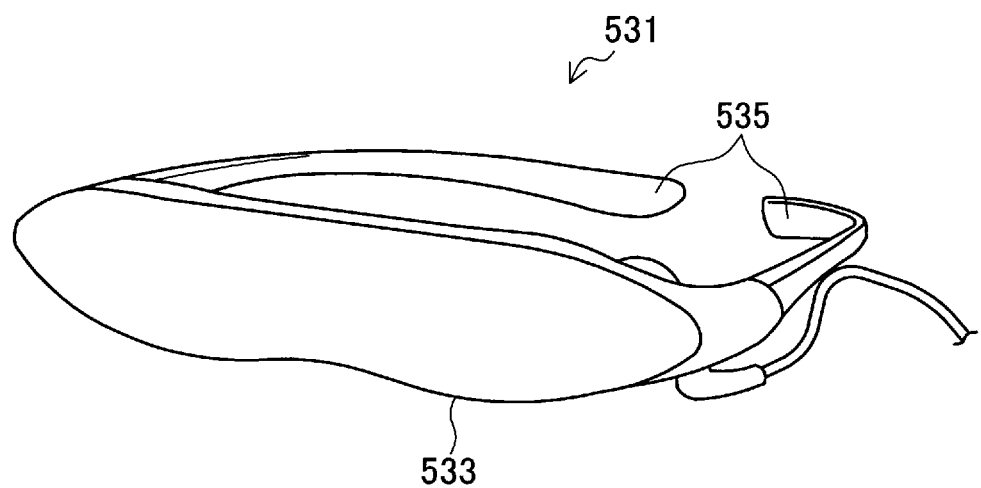
FIG. 17 is a diagram showing an external appearance of a head-mounted display that is another example of an electronic apparatus in which the display device according to the present embodiment can be used.

FIG. 17 is a diagram showing an external appearance of a head mounted display (HMD) that is another example of the electronic apparatus in which the display device 1 according to the present embodiment can be used. As shown in FIG. 17, an HMD 531 includes an eyeglass-type display section 533 that displays various pieces of information and ear-fixing sections 535 that are fixed to the user's ears during wearing. The display device 1 may be applied to the display section 533.

Hereinabove, some examples of the electronic apparatus in which the display device 1 according to the present embodiment can be used are described. Note that the electronic apparatus in which the display device 1 can be used is not limited to those described above as examples, and the display device 1 can be used for display devices that are mounted on electronic apparatuses in all fields that perform display on the basis of an image signal inputted from the outside or an image signal generated in the inside, such as a television device, an electronic book, a smart phone, a personal digital assistant (PDA), a notebook personal computer (PC), a video camera, and a game apparatus.

7. Supplement

The preferred embodiment (s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, although in the embodiment described above each of the transistors (the driving transistor 212, the sampling transistor 213, the light emission control transistor 214, and the switching transistor 217) included in the driving circuit of the pixel circuit 210 is of a P-channel type, the technology according to the present disclosure is not limited to this example. For example, each of these transistors may be of an N-channel type.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display device including:

a pixel unit which is configured with a plurality of pixel circuits arranged in a matrix, each of the pixel circuits including a light emitting element and a driving circuit for driving the light emitting element;

scanning lines which are interconnections connected to the respective pixel circuits and are provided to extend in a first direction and correspond to respective rows of a plurality of the pixel circuits; and signal lines which are interconnections connected to the respective pixel circuits and are provided to extend in a second direction orthogonal to the first direction and correspond to respective columns of a plurality of the pixel circuits, in which one of the scanning lines and the signal lines, provided for the one pixel circuit, which is larger in number is positioned in a lower-level interconnection layer, and an electrode of a capacitance element included in the driving circuit is positioned in the interconnection layer in which either the scanning lines or the signal lines are provided.

(2)

The display device according to (1), in which the driving circuit includes a plurality of transistors, and a plurality of interconnection layers each having the scanning lines, the signal lines, and the capacitance element formed therein are stacked on a diffusion layer in which a plurality of the transistors are formed.

(3)

The display device according to (2), in which the light emitting element is an organic light emitting diode, and the organic light emitting diode is positioned on the interconnection layer of an uppermost layer.

(4)

The display device according to any one of (1) to (3), in which one sub-pixel includes the one pixel circuit, and one pixel includes the four sub-pixels.

(5)

The display device according to any one of (1) to (4), in which the number of the scanning lines is larger than the number of the signal lines.

(6)

The display device according to any one of (1) to (5), in which the scanning lines are interconnections extending in a horizontal direction, and the signal lines are interconnections extending in a vertical direction.

(7)

The display device according to any one of (1) to (6), in which all of a plurality of the scanning lines are positioned in a same interconnection layer or all of a plurality of the signal lines are positioned in a same interconnection layer.

(8)

The display device according to any one of (1) to (7), in which a plurality of the scanning lines are disposed to be dispersed in a plurality of different interconnection layers or a plurality of the signal lines are disposed to be dispersed in a plurality of different interconnection layers.

(9)

An electronic apparatus including:

a display device which performs display on the basis of a video signal, in which the display device includes a pixel unit which is configured with a plurality of pixel circuits arranged in a matrix, each of the pixel circuits including a light emitting element and a driving circuit for driving the light emitting element, scanning lines which are interconnections connected to the respective pixel circuits and are provided to extend in a first direction and correspond to respective rows of a plurality of the pixel circuits, and signal lines which are interconnections connected to the respective pixel circuits and are provided to extend in a second direction orthogonal to the first direction and correspond to respective columns of a plurality of the pixel circuits, one of the scanning lines and the signal lines, provided for the one pixel circuit, which is larger in number is positioned in a lower-level interconnection layer, and an electrode of a capacitance element included in the driving circuit is positioned in the interconnection layer in which either the scanning lines or the signal lines are provided.

REFERENCE SIGNS LIST 1 display device
10 display panel
20 pixel unit
30 scanning unit
40 selection unit
210, 220 pixel circuit
211, 221 organic light emitting diode
212 driving transistor
213 sampling transistor
214 light emission control transistor
215, 227 holding capacitance
216 auxiliary capacitance
217 switching transistor
222, 223, 224, 225, 226 transistor
228 H scanning line
229 V signal line
231 diffusion layer
232, 235, 238, 241 insulating layer
233 contact
236, 239, 242 via
234, 237, 240 interconnection layer
243 anode
251 capacitance element lower electrode
252, 254 capacitance element upper electrode
261 organic layer
301 writing scanning unit
302 writing scanning line
311 first driving scanning unit
312 first driving line
321 second driving scanning unit
322 second driving line
331 common power supply line
332 power supply line
333 ground line
401 signal output unit
402 signal line
501 smartphone (electronic apparatus)
511 digital camera (electronic apparatus)
531 HMD (electronic apparatus)

The invention claimed is:

1. A display device comprising:
a substrate;
a plurality of pixel circuits, each of the pixel circuits including a sampling transistor, a driving transistor, a first switching transistor, a second switching transistor, a capacitive element and a light emitting element;
a plurality of scanning lines including a first scanning line, a second scanning line and a third scanning line, the first scanning line being connected to a control terminal of the sampling transistor, the second scanning line being connected to a control terminal of the first switching transistor, and the third scanning line being connected to a control terminal of the second switching transistor; and
a plurality of signal lines including a first signal line, the first signal line being connected to a first terminal of the sampling transistor, wherein
a first terminal of the driving transistor is electrically connected to a first terminal of the first switching transistor,
the first terminal of the driving transistor is electrically connected to a first terminal of the second switching transistor,
a second terminal of the second switching transistor is electrically connected to an anode electrode of the light emitting element,
the first scanning line and the second scanning lines are disposed in a first interconnection layer, the first signal line is disposed in a second interconnection layer,
a first electrode of the capacitive element is disposed in a third interconnection layer,
the second interconnection layer is disposed between the first interconnection layer and the third interconnection layer,
the first and the second scanning lines extend in a first direction, and
the first signal line extends in a second direction perpendicular to the first direction.

2. The display device according to claim 1, wherein a second electrode of the capacitive element is disposed in the second interconnection layer.

3. The display device according to claim 1, wherein the third scanning line is disposed in the first interconnection layer.

4. The display device according to claim 1, wherein the third scanning line extends in the first direction.

* * * * *